United States Patent
Cha et al.

(10) Patent No.: US 12,250,854 B2
(45) Date of Patent: Mar. 11, 2025

(54) DISPLAY DEVICE

(71) Applicant: Samsung Display Co., Ltd., Yongin-si (KR)

(72) Inventors: Hyunji Cha, Hwaseong-si (KR); Dong Eup Lee, Anyang-si (KR); Hyunji Kang, Hwaseong-si (KR); Young-Soo Yoon, Seoul (KR); Yun-Kyeong In, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 756 days.

(21) Appl. No.: 17/477,539

(22) Filed: Sep. 17, 2021

(65) Prior Publication Data
US 2022/0199744 A1    Jun. 23, 2022

(30) Foreign Application Priority Data
Dec. 21, 2020  (KR) .......................... 10-2020-0179658

(51) Int. Cl.
*H10K 59/131*  (2023.01)
*H10K 50/84*  (2023.01)
*H10K 59/121*  (2023.01)
*H10K 102/00*  (2023.01)

(52) U.S. Cl.
CPC .......... *H10K 59/131* (2023.02); *H10K 50/84* (2023.02); *H10K 59/1213* (2023.02); *H10K 59/1216* (2023.02); *H10K 2102/311* (2023.02)

(58) Field of Classification Search
None
See application file for complete search history.

(56) References Cited

U.S. PATENT DOCUMENTS

| | | | |
|---|---|---|---|
| 10,270,052 B2 | 4/2019 | Voges et al. | |
| 10,559,597 B1* | 2/2020 | Li | H01L 27/1255 |
| 10,825,886 B2 | 11/2020 | Na et al. | |
| 2019/0312096 A1* | 10/2019 | Na | H10K 50/11 |
| 2020/0203458 A1* | 6/2020 | Jin | H10K 59/87 |
| 2020/0265782 A1* | 8/2020 | Kim | G01N 27/4166 |
| 2020/0365664 A1* | 11/2020 | Jeon | H10K 71/00 |
| 2022/0320231 A1* | 10/2022 | Zhang | H10K 59/131 |

FOREIGN PATENT DOCUMENTS

| | | |
|---|---|---|
| KR | 10-1621559 | 5/2016 |
| KR | 10-2018-0049296 | 5/2018 |
| KR | 10-2023232 | 9/2019 |
| KR | 10-2020-0108212 | 9/2020 |

* cited by examiner

*Primary Examiner* — Xiaoming Liu
(74) *Attorney, Agent, or Firm* — KILE PARK REED & HOUTTEMAN PLLC

(57) ABSTRACT

A display device includes a first scan line spaced apart from a signal transmission region and a second scan line having a portion that is adjacent to the signal transmission region. The second scan line adjacent to the signal transmission region bypasses the signal transmission region. A compensation signal line connects one end of the second scan line and the other end thereof, and results in a decrease in a combined resistance of the second scan line.

24 Claims, 20 Drawing Sheets

DISPLAY DEVICE

CROSS-REFERENCE TO RELATED APPLICATIONS

This application claims priority from and the benefit of Korean Patent Application No. 10-2020-0179658, filed on Dec. 21, 2020, which is hereby incorporated by reference for all purposes as if fully set forth herein.

BACKGROUND

Field

Embodiments of the invention relate generally to a display device, and more particularly, to a display device provided with a region that does not display images and that transmits an optical signal.

Discussion of the Background

In recent years, portable electronic devices have been widely used, and functions thereof have become more and more diverse. A user typically prefers an electronic device having a larger display region and a narrower non-display region, which is especially the case as electronic devices are getting smaller and smaller in size.

In order to reduce the area of a non-display region, electronic devices in various forms are being developed.

The above information disclosed in this Background section is only for understanding of the background of the inventive concepts, and, therefore, it may contain information that does not constitute prior art.

SUMMARY

Devices constructed according to embodiments and implementations of the embodiments are capable of increasing a size of a display region of a display device.

The disclosure provided hereinbelow provides a display device capable of decreasing a luminance deviation between different display regions adjacent to an optical signal transmission region.

Additional features of the inventive concepts will be set forth in the description which follows, and in part will be apparent from the description, or may be learned by practice of the inventive concepts.

An embodiment of the inventive concepts provides a display device including a display panel, wherein the display panel includes a first region in which first pixels of a first pixel row, second pixels of a second pixel row, and third pixels of a third pixel row are disposed and a second region in which the second pixel row and the third pixel row are disconnected and which includes a signal transmission region. The display panel may include a first scan line which is electrically connected to the first pixels and overlaps the first region, a second scan line which is electrically connected to the second pixels, overlaps the first region and the second region, and is longer than the first scan line, a third scan line which is electrically connected to the third pixels, overlaps the first region and the second region, and is longer than the second scan line, a first compensation line which is disposed on a different layer from the first to third scan lines, and electrically connects a first point of the second scan line and a second point of the second scan line, and a second compensation line which is disposed on a different layer from the first to third scan lines, and electrically connects a first point of the third scan line and a second point of the third scan line.

The signal transmission region is a region in which an optical signal is transmitted, and the second region includes a wiring region which is adjacent to the signal transmission region, wherein the first compensation line and the second compensation line may overlap the wiring region.

The signal transmission region may pass through the display panel.

The display panel may include a base layer, a circuit element layer disposed on the base layer and including the first scan line, the second scan line, and the third scan line, and a display element layer disposed on the circuit layer. The thickness of the signal transmission region of the display panel may be smaller than the thickness of the wiring region.

The display panel may include a base layer, a circuit element layer disposed on the base layer and including the first scan line, the second scan line, and the third scan line, a display element layer disposed on the circuit layer, and an encapsulation substrate configured to encapsulate the display element layer. The thickness of a first portion of the display element layer corresponding to the signal transmission region may be smaller than the thickness of a second portion of the display element layer corresponding to the wiring region.

Within an extension direction of the first scan line, the first point of the second scan line and the first point of the third scan line may be disposed on one side of the signal transmission region, and the second point of the second scan line and the second point of the third scan line may be disposed on the other side of the signal transmission region. The first to fourth points are positioned in the second region.

In the first region, the first scan line, the second scan line, and the third scan line may be disposed on the same layer.

In the second region, the second scan line and the third scan line may be disposed on different layers from each other. In the second region, the first compensation line and the second compensation line may be disposed on different layers from the second scan line and the third scan line.

In the second region, the first compensation line and the second compensation line may be disposed on the same layer.

The display device may further include a bridge electrode. The second scan line may include a first portion disposed in the first region, and a second portion disposed in the second region and disposed on a different layer from the first portion. The bridge may connect the first portion, the second portion, and the first compensation line.

One first pixel of the first pixels connected to the first scan line may be disposed on one side of the second region, and another first pixel thereof may be disposed on the other side of the second region. One second pixel of the second pixels connected to the second scan line may be disposed on one side of the second region, and another second pixel thereof may be disposed on the other side of the second region. The one first pixel and the one second pixel may be disposed in a first pixel column. The another first pixel and the another second pixel may be disposed in a second pixel column.

A portion of the second scan line overlapping the second region may have a curved shape, and the first compensation line may overlap the portion of the curved shape.

The second compensation line may be longer than the first compensation line.

A compensation electrode disposed in the second may be further included. The compensation electrode may be disposed on a different layer from the third scan line, the first compensation line, and the second compensation line. The compensation electrode may overlap at least one of the third scan line and the second compensation line, and the compensation electrode may not overlap the second scan line and the first compensation line.

Each of the first pixels may receive a first power voltage and a second power voltage which is lower than the first power voltage, and the compensation electrode may receive the first power voltage.

A voltage line extended in a direction intersecting the first to third pixel rows, disposed on a different layer from the third scan line, the first compensation line, and the second compensation line, and transmitting the first power voltage, and a connection line connecting the voltage line and the compensation electrode may be further included.

A data line disposed in the first region and the second region, and electrically connected to corresponding pixels among the first pixels, the second pixels, and the third pixels may be further included. A portion of the data line may overlap the connection line in the second region. Combined resistance of the third scan line and the second compensation line may be smaller than combined resistance of the second scan line and the second compensation line.

The display device may be foldable based on a folding axis overlapping the first region.

Each of the first pixels may include a light emitting diode electrically connected to a first voltage line which receives a first power voltage, and in which the light emitting diode receives a second power voltage which is lower than the first power voltage, a capacitor electrically connected between the first voltage line and a reference node, a first transistor electrically connected between the first voltage line and a first electrode of the light emitting diode, a second transistor electrically connected between a data line and a source or a drain of the first transistor, a third transistor electrically connected between the reference node and the drain or the source of the first transistor, a fourth transistor electrically connected between a second voltage line receiving an initialization voltage and the reference node, a fifth transistor electrically connected between the first voltage line and the source or the drain of the first transistor, a sixth transistor electrically connected between the drain or the source of the first transistor and the first voltage line, and a seventh transistor electrically connected between the second voltage line and the first electrode of the light emitting diode.

The first transistor, the second transistor, the fifth transistor, and the sixth transistor may be P-type transistors, and the third transistor and the fourth transistor may be N-type transistors.

An active region of each of the first transistor, the second transistor, the fifth transistor, and the sixth transistor may include polysilicon. An active region of each of the third transistor and the fourth transistor may include a metal oxide.

In an embodiment of the inventive concepts, a display device includes a display panel, wherein the display panel includes a first region in which pixels are disposed and a second region in which pixels are not disposed and having a light transmittance that is higher than that of the first region. The display panel may include a first scan line which is electrically connected to corresponding pixels among the pixels, overlaps the first region, and does not overlap the second region, a second scan line which is electrically connected to corresponding pixels among the pixels, overlaps the first region and the second region, and is longer than the first scan line, a third scan line which is electrically connected to corresponding pixels among the pixels, overlaps the first region and the second region, and is longer than the second scan line, a first compensation line which is disposed on a different layer from the first to third scan lines, and electrically connects a first point of the second scan line and a second point of the second scan line, and a second compensation line which is disposed on a different layer from the first compensation line and the first to third scan lines, and electrically connects a first point of the third scan line and a second point of the third scan line.

A compensation electrode disposed in the second region may be further included, wherein the compensation electrode may be disposed on a different layer from the third scan line, the first compensation line, and the second compensation line, the compensation electrode may overlap at least one of the third scan line and the second compensation line, and the compensation electrode may not overlap the second scan line and the first compensation line.

It is to be understood that both the foregoing general description and the following detailed description are illustrative and explanatory and are intended to provide further explanation of the invention as claimed.

BRIEF DESCRIPTION OF THE FIGURES

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1A:
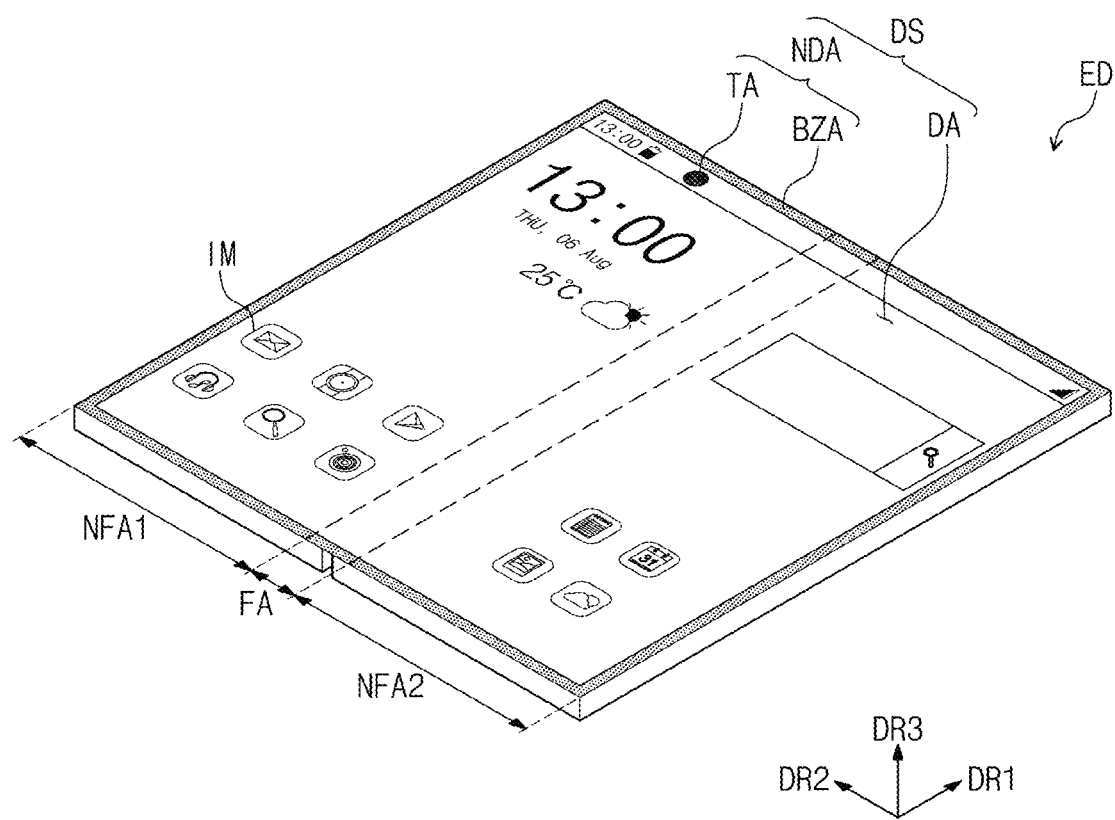
FIG. 1A and FIG. 1B are perspective views of an electronic device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the illustrative term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, embodiments of the inventive concepts will be described with reference to the accompanying drawings.

Figure 1B:
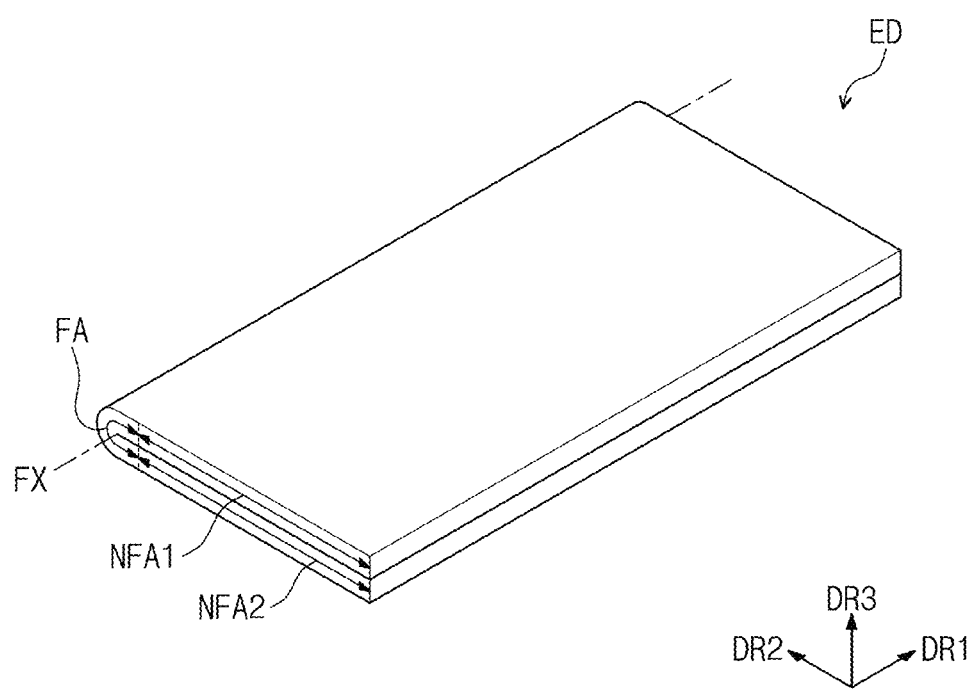

FIG. 1A and FIG. 1B are perspective views of an electronic device ED according to an embodiment. FIG. 1A illustrates an unfolded state of the electronic device ED, and FIG. 1B illustrates a folded state thereof.

Referring to FIG. 1A and FIG. 1B, the electronic device ED according to an embodiment may include display surface DS defined by a first direction DR1 and a second direction DR2 intersecting the first direction DR1. The electronic device ED may provide an image IM to a user through the display surface DS.

The display surface DS may include a display region DA and a non-display region NDA around the display region DA. The display region DA displays the image IM, and the non-display region NDA may not display the image IM. The non-display region NDA is a region on which an image is not displayed. The non-display region NDA may include a first non-display region TA and a second non-display region BZA.

The first non-display region TA is a region capable of transmitting an optical signal. Here, the optical signal may be external natural light, or for example, infrared ray generated in a light emission element. One first non-display region TA is illustrated, but a plurality of first non-display regions TA may be provided. The first non-display region TA may be disposed in each of a first non-folding region NFA1 and a second non-folding region NFA2, both to be described later. A first non-folding region TA of the second non-folding region NFA2 may be disposed on a different line from the first non-folding region TA of the second non-folding region NFA2 in the first direction DR1 and/or the second direction DR2. In the embodiment described herein, the first non-display region TA may be surrounded by the display region DA. On a plane, the first non-display region TA is disposed spaced apart from the second non-display region BZA.

The second non-display region BZA is a region for blocking an optical signal, and may be disposed on the outside the display region DA and surround the display region DA. In an embodiment, the second non-display region BZA may be disposed, not on a front surface, but on a side surface of the electronic device ED. In the embodiment described herein, the second non-display region BZA surrounding the display region DA is illustrated, but the embodiment is not limited thereto. It is sufficient as long as the second non-display region BZA is disposed on one side of the display region DA. The second non-display region may be disposed only in regions facing each other in the first direction DR1.

Hereinafter, a direction substantially perpendicularly crossing a plane defined by the first direction DR1 and the second direction DR2 is defined as a third direction DR3. In addition, in the embodiments described herein, "on a plane" may be defined as a state viewed in the third direction DR3.

Hereinafter, the first to third directions DR1, DR2, and DR3 are directions respectively indicated by first to third direction axes DR1, DR2, and DR3, and are given the same reference numerals.

The electronic device ED may include a folding region FA and the first and second non-folding regions NFA1 and NFA2. In the second direction DR2, the folding region FA may be disposed between the first non-folding region NFA1 and the second non-folding region NFA2.

As illustrated in FIG. 1B, the folding region FA may be folded on the basis of a folding axis FX which is parallel to the second direction DR2. The folding region FA has a predetermined curvature and a predetermined radius of curvature. The first non-folding region NFA1 and the second non-folding region NFA2 face each other, and the electronic device ED may be subjected to inner-folding such that the display surface DS is not to be exposed to the outside.

In an embodiment, the electronic device ED may be subjected to outer-folding such that the display surface DS is to be exposed to the outside. In an embodiment, the electronic device ED may be configured such that an inner-folding or outer-folding operation may be repeated with an unfolding operation, but embodiments of the inventive concepts are not limited thereto. In an embodiment, the electronic device ED may be configured to be able to choose any one of an unfolding operation, an inner-folding operation, and an outer-folding operation. A foldable display device is illustrated, but the embodiment is not limited thereto. The electronic device ED according to an embodiment may also be applied in a non-foldable electronic device which does not have a foldable function.

Figure 2A:
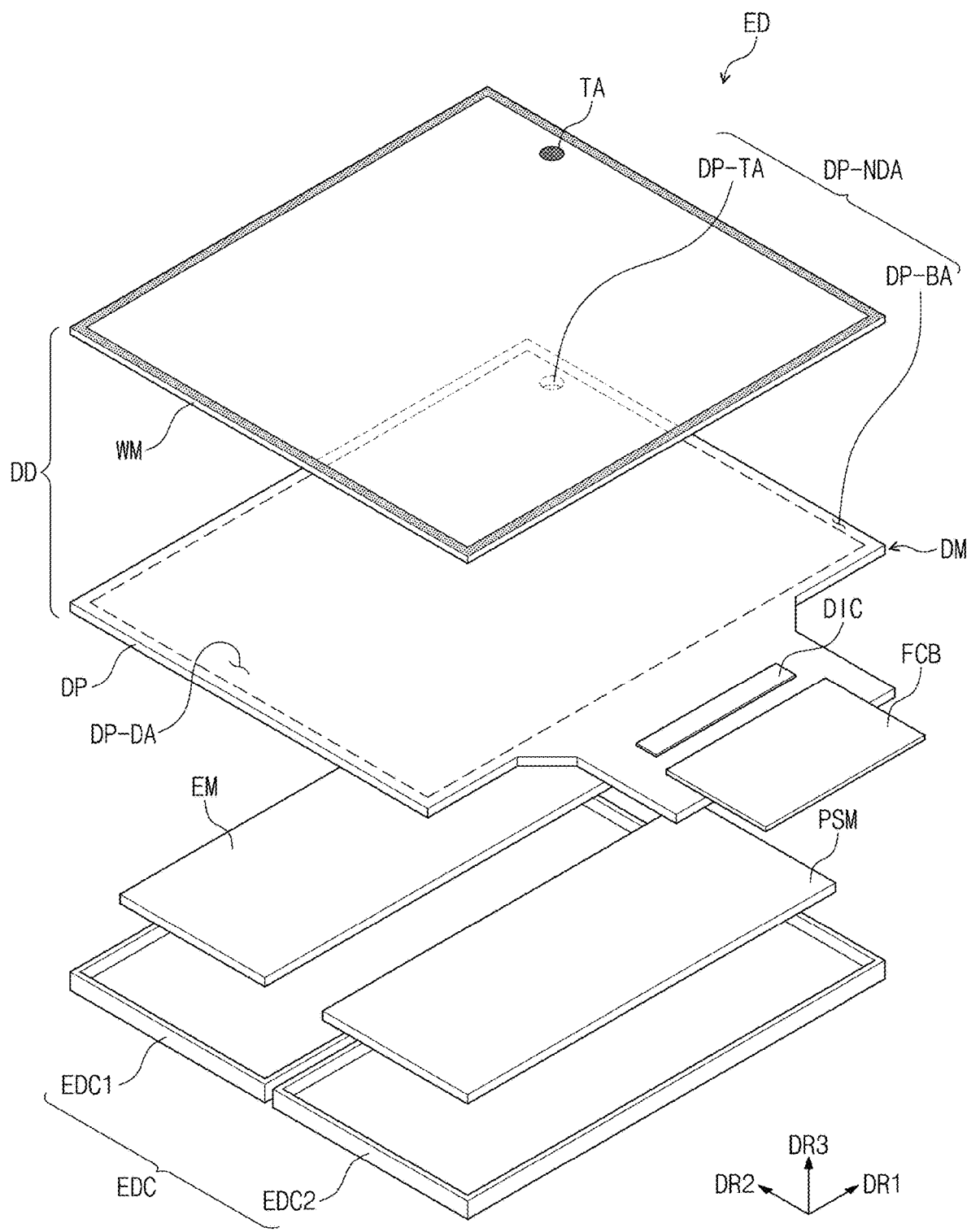
FIG. 2A is an exploded perspective view of an electronic device according to an embodiment.
Figure 2B:
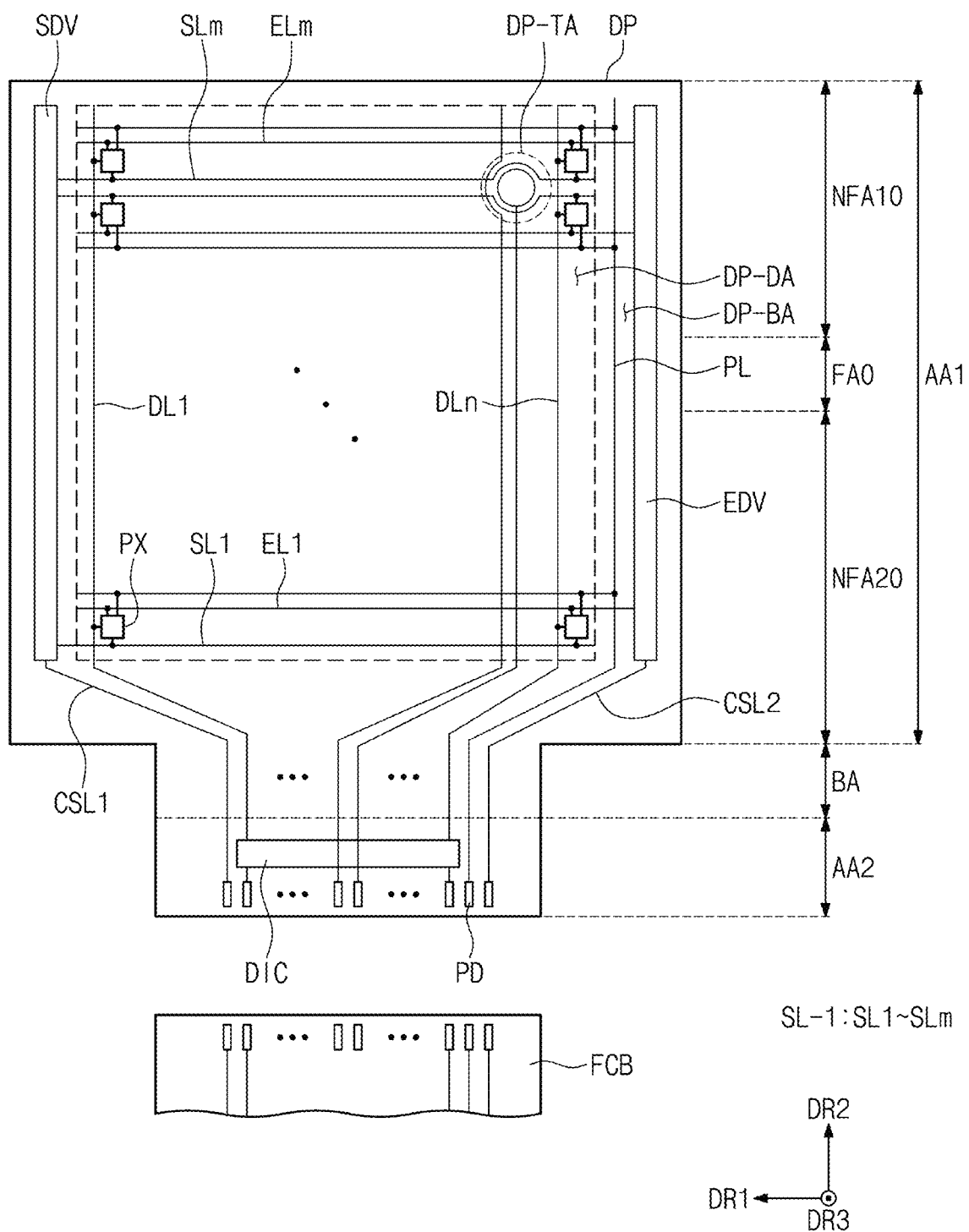
FIG. 2B is a plan view of a display panel according to an embodiment.

FIG. 2A is an exploded perspective view of the electronic device ED according to an embodiment. FIG. 2B is a plan view of a display panel DP according to an embodiment.

As illustrated in FIG. 2A, the electronic device ED may include a display device DD, an electronic module EM, a power module PSM, and a case EDC. The electronic device ED may further include an instrument structure for controlling a folding operation of the display device DD.

The display device DD generates an image and senses an external input. The display device DD includes a window WM and a display module DM. The window WM provides the front surface of the electronic device ED. The window WM may include a thin plastic substrate or a thin glass substrate.

The display module DM may include at least the display panel DP. In the embodiment described herein, the display panel DP is described as a light emitting type display panel. The light emitting type display panel may include an organic light emitting display panel or an inorganic (quantum dot or LED) light emitting display panel. The display panel DP includes a pixel region DP-DA and a non-pixel region DP-NDA respectively corresponding to the display region DA (see FIG. 1A) and the non-display region NDA (see FIG. 1A) of the electronic device ED. The non-pixel region DP-NDA includes a pixel row disconnection region DP-TA and a peripheral region DP-BA respectively corresponding to the first non-display region TA and the second non-display region BZA. Hereinafter, for convenience of description, the pixel region DP-DA, the pixel row disconnection region DP-TA, and the peripheral region DP-BA are respectively defined as a first region DP-DA, a second region DP-TA, and a third region DP-BA.

In addition, as used herein, the sentence "a region/portion corresponds to a region/portion" connotes that they overlap each other, and is not limited to having the same area. The display module DP may include a driving chip DIC disposed in one side of the third region DP-BA. The display module DM may further include a flexible circuit film FCB coupled to one side of the third region DP-BA.

The electronic module EM includes at least a main controller. The electronic module EM may include a wireless communication module, a camera module, a proximity sensor module, an image input module, a sound input module, a sound output module, a memory, an external interface module, and the like. The modules may be mounted on a circuit board, or may be electrically connected though a flexible circuit board. The electronic module EM is electrically connected to the power module PSM. The camera module or proximity sensor module may be disposed on a lower side of the display module DM to correspond to the first non-display region TA.

The main controller controls the overall operation of the electronic device ED. For example, the main controller activates or deactivates the display device DD in accordance with a user input. The main controller may control the operation of the display device DD and other modules. The main controller may include at least one microprocessor.

The case EDC receives the display module DM, the electronic module EM, and the power module PSM. The case EDC is illustrated as two cases EDC1 and EDC2 separated from each other, but the embodiment is not limited thereto. The electronic device ED may further include a hinge structure for connecting the two cases EDC1 and EDC2. The case EDC may be coupled to the window WM. The case EDC protects the received components, that is, the display module DM, the electronic module EM, the power module PSM, and the like.

Referring to FIG. 2B, the pixel region DP-DA and the non-pixel region DP-NDA are distinguished by the presence of the pixel PX. In the first region DP-DA, the pixel PX is disposed. In the second region DP-TA, the pixel PX is not disposed. The second region DP-TA may be surrounded by the first region DP-DA. In the third region DP-BA, the pixel PX is not disposed, but a scan driver SDV, a data driver, and a light emission driver EDV may be disposed. The data driver may be some circuits configured in the driving chip DIC illustrated in FIG. 2B.

The plurality of pixels PX may include a plurality of groups that generate different color lights. For example, the pixels may include red pixels which generate red color light, green pixels which generate green color light, and blue pixels that generate blue color light. A light emitting diode of a red pixel, a light emitting diode of a green pixel, and a light emitting diode of a blue pixel may include a light emitting layer of different materials.

The display panel DP includes a front surface region AA1, a rear surface region AA2, and a bending region BA distinguished in the second direction DR2. The rear surface region AA2 and the bending region BA may be some regions of the non-pixel region DP-NDA. The bending region BA is disposed between the front surface region AA1 and the rear surface region AA2.

FIG. 2B illustrates the unfolded state of the bending region BA before being bent. Assuming that the display panel DP is installed in the electronic device ED, when the electronic device ED is unfolded as shown in FIG. 1A, the front surface region AA1 and the rear surface region AA2 of the display panel DP are disposed on different planes.

The front surface region AA1 is a region corresponding to the display surface DS of FIG. 1A. The front region AA1 may include a first non-folding region NFA10, a second non-folding region NFA20, and a folding region FAO. The first non-folding region NFA10, the second non-folding region NFA20, and the folding region FAO respectively correspond to the first non-folding region NFA1, the second non-folding region NFA2, and the folding region FA of FIG. 1A and FIG. 1B.

The display panel DP may include a plurality of pixels PX, a plurality of scan lines SL1 to SLm, a plurality of data lines DL1 to DLn, a plurality of light emission lines EL1 to ELm, first and second control lines CSL1 and CSL2, a first power line PL and a plurality of pads PD. Here, m and n are integer values greater than or equal to one (i.e., natural numbers). The pixels PX may be connected to the scan lines SL1 to SLm, the data lines DL1 to DLn, and the light emission lines EL1 to ELm.

The scan lines SL1 to SLm may be extended in the second direction DR2, and connected to the scan driver SDV. The data lines DL1 to DLn are extended in the first direction DR2, and may be connected to the driving chip DIC via the bending region BA. The light emission lines EL1 to ELm may be extended in the first direction DR1 and connected to the light emission driver EDV. In the embodiment described herein, it is illustrated that the light emission lines EL1 to ELm are disposed for each pixel row. However, in an embodiment, one light emission line may be disposed for every two pixel rows.

The first voltage line PL may include a portion extended in the second direction DR2 and a portion extended in the first direction DR1. The portion extended in the second direction DR2 and the portion extended in the first direction DR1 may be disposed on different layers. The portion extended in the second direction DR2 of the first voltage line PL may be extended to the rear surface region AA2 via the bending region BA. The first voltage line PL may provide a first power voltage to the pixels PX.

A first control line CSL1 is connected to the scan driver SDV, and may be extended toward a lower end of the rear surface region AA2 via the bending region BA. A second control line CSL2 is connected to the light emission driver EDV, and may be extended toward the lower end of the rear surface region AA2 via the bending region BA.

When viewed on a plane, the pads PD may be disposed adjacent to the lower end of the rear surface region AA2. The driving chip DIC, the first power line PL, the first control line CSL1, and the second control line CSL2 may be connected to the pads PD. The flexible circuit film FCB may be electrically connected to the pads through an anisotropic conductive adhesive layer.

Figure 3A:
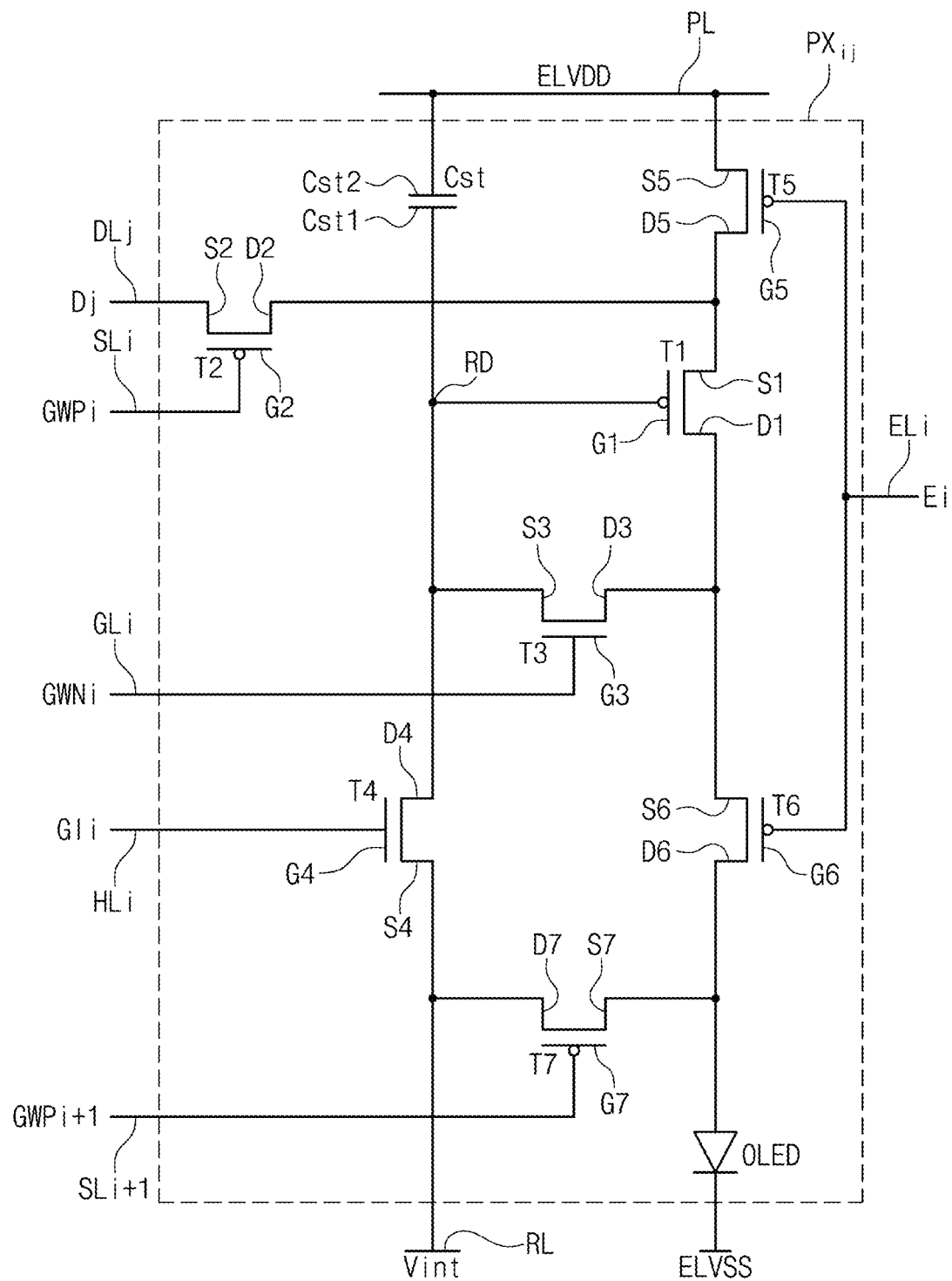
FIG. 3A is an equivalent circuit diagram of a pixel according to an embodiment.
Figure 3B:
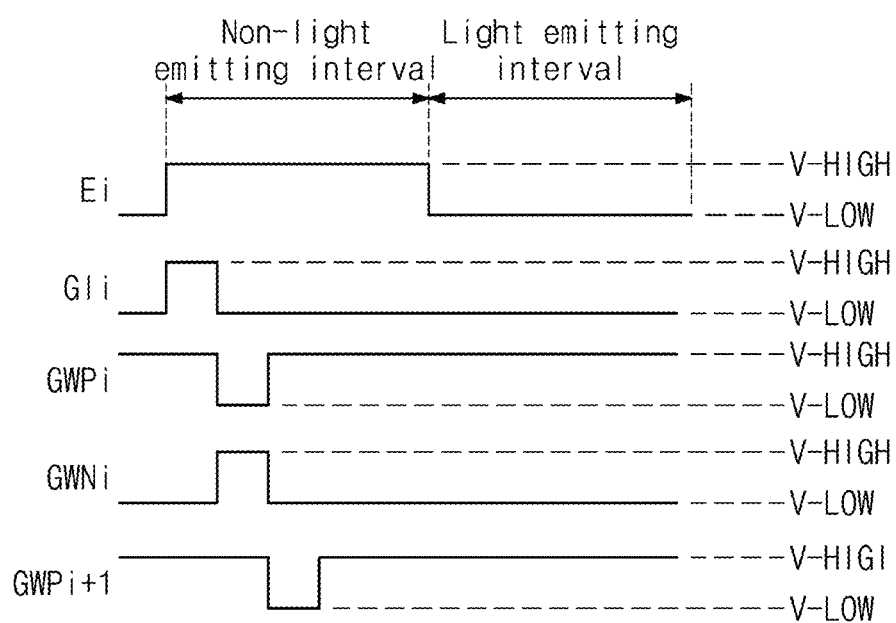
FIG. 3B is a waveform diagram of driving signals for driving the pixel shown in FIG. 3A.

FIG. 3A is an equivalent circuit diagram of a pixel PXij according to an embodiment. FIG. 3B is a waveform diagram of driving signals for driving the pixel PXij illustrated in FIG. 3A.

FIG. 2B illustrates only the scan lines SL1 to SLm of a first group SL-1, but the display panel DP may further include another scan line group. FIG. 3A illustrates an i-th scan line GLi of a second group and an i-th scan line HLi of a third group, which are connected to the pixel PXij. Scan lines included in the same group are formed by the same process, and thus, have the same stacking structure and the same line resistance.

When describing the disposition of scan lines of the second group and scan lines of the third group referring to FIG. 2B, the scan lines of the second group may be disposed to respectively correspond to the scan lines SL1 to SLm of the first group SL-1, and the scan lines of the third group may be disposed to respectively correspond to the scan lines SL1 to SLm of the first group SL-1. One scan line of the first group SL-1, one scan line of the second group, and one scan line of the third group are disposed to correspond to each pixel row.

The first voltage line PL receiving a first power voltage ELVDD and a second power voltage RL receiving an initialization voltage Vint may each be electrically connected to the pixel PXij. The initialization voltage Vint has a lower level than the first power voltage ELVDD. A second power voltage ELVSS is applied to the display panel DP. The second power voltage ELVSS has a lower level than the first power voltage ELVDD. The second power voltage ELVSS is applied to a light emitting diode OLED.

FIG. 3A illustrates the pixel PXij connected to an i-th scan line SLi among the scan lines SL1 to SLm (see FIG. 2B) of the first group SL-1, and connected to a j-th data line DLj among the plurality of data lines DL1 to DLn (see FIG. 2B). In the embodiment, a pixel driving circuit may include first to seventh transistors T1 to T7 and a capacitor Cst. In the embodiment, a first transistor T1, a second transistor T2, a fifth transistor T5, and a seventh transistor T7 are P-type transistors, and a third transistor T3 and a fourth transistor T4 are described as N-type transistors. However, the embodiment described herein is not limited thereto. The first to seventh transistors T1 to T7 may be implemented as either P-type transistors or N-type transistors. Also, in an embodiment, at least one of the first to seventh transistors T1 to T7 may be omitted.

In the embodiment, the first transistor T1 may be a driving transistor, and the second transistor T2 may be a switching transistor. The capacitor Cst is connected between the first voltage line PL receiving the first power voltage ELVDD and a reference node RD. The capacitor Cst includes a first electrode Cst1 connecting to the reference node RD and a second electrode Cst2 connecting to the first voltage line PL.

The first transistor T1 is connected between the first voltage line PL and one electrode of the light emitting diode OLED. A source S1 of the first transistor T1 is electrically connected to the first voltage line PL. In the embodiments described herein, "being electrically connected between a transistor and a signal line or between a transistor and a transistor" connotes that "a source, a drain, and a gate of a transistor have an integral shape with a signal line or are connected through a connection electrode." Between the source S1 of the first transistor T1 and the first voltage line PL, another transistor may be disposed or omitted.

A drain D1 of the first transistor T1 is electrically connected to an anode of the light emitting diode OLED. A gate G1 (hereinafter, a first gate) of the first transistor T1 is electrically connected to the reference node RD. The second transistor T2 is connected between the j-th data line DLj and the source S1 of the first transistor T1. A source S2 of the second transistor T2 is electrically connected to the j-th data line DLj, and a drain D2 of the second transistor T2 is electrically connected to the source S1 of the first transistor T1. In the embodiment, a gate G2 of the second transistor T2 may be electrically connected to the i-th scan line SLi of the first group SL-1.

The third transistor T3 is connected between the reference node RD and the drain D1 of the first transistor T1. A drain D3 of the third transistor T3 is electrically connected to the drain D1 of the first transistor T1, and a source S3 of the third transistor T3 is electrically connected to the reference node RD. The fourth transistor T4 is connected between the reference node RD and the second voltage line RL. A drain D4 of the fourth transistor T4 is electrically connected to the reference node RD, and a source S4 of the fourth transistor T4 is electrically connected to the second voltage line RL.

The fifth transistor T5 is connected between the first voltage line PL and the source S1 of the first transistor T1. A source S5 of the fifth transistor T5 is electrically connected to the first voltage line PL, and a drain D5 of the fifth transistor T5 is electrically connected to the source S1 of the first transistor T1. A gate G5 of the fifth transistor T5 may be electrically connected to an i-th light emission line ELi.

A sixth transistor T6 is connected between the drain D1 of the first transistor T1 and the light emitting diode OLED. A source S6 of the sixth transistor T6 is electrically connected to the drain D1 of the first transistor T1, and a drain D5 of the sixth transistor T6 is electrically connected to the anode of the light emitting diode OLED. A gate G6 of the sixth transistor T6 may be electrically connected to the i-th light emission line ELi. In an embodiment, the gate G6 of the sixth transistor T6 may be connected to a different signal line from the gate G5 of the fifth transistor T5.

The seventh transistor T7 is connected between the drain D6 of the sixth transistor T6 and the second voltage line RL. A source S7 of the seventh transistor T7 is electrically connected to the drain D6 of the sixth transistor T6, and a drain D7 of the seventh transistor T7 is electrically connected to the second voltage line RL. A gate G7 of the seventh transistor T7 may be electrically connected to an i+1-th scan line SLi+1 of the first group SL-1.

Referring to FIG. 3A and FIG. 3B, the operation of the pixel PXij will be described in more detail. The display panel DP (see FIG. 2B) displays an image for each frame interval. During each frame interval, signal lines of each of the scan lines and light emission lines EL1 to ELn of the first group SL-1 (see FIG. 2B) are sequentially scanned. Signal lines of each of the scan lines of the second group and the scan lines of the third group are also sequentially scanned. FIG. 3B illustrates a portion of any one frame interval.

Referring to FIG. 3B, each of signals Ei, GIi, GWNi, GWPi, and GWPi+1 may have a high level V-HIGH during some intervals and may have a low level V-LOW during some intervals. N-type transistors are turned on when a corresponding signal has the high level V-HIGH, and P-type transistors are turned on when a corresponding signal has the low level V-LOW.

When a light emission control signal Ei has the high level V-HIGH, the fifth transistor T5 and the sixth transistor T6 are turned off. When the fifth transistor T5 and the sixth transistor T6 are turned off, a current path is not formed between the first voltage line PL and the light emitting diode OLED. Therefore, a corresponding interval may be defined as a non-light emitting interval.

When a first scan signal GIi applied to the i-th scan line HLi of the third group has the high level V-HIGH, the fourth transistor T4 is turned on. When the fourth transistor T4 is turned on, the reference node RD is initialized by the initialization voltage Vint.

When a second scan signal GWPi applied to the i-th scan line SLi of the first group SL-1 has the low level V-LOW and a third scan signal GWNi applied to the i-th scan line GLi of the second group has the high level V-HIGH, the second transistor T2 and the third transistor T3 are turned on.

Since the reference node RD is initialized to the initialization voltage Vint, the first transistor T1 is in the state of being turned on. When the first transistor T1 is turned on, a voltage corresponding to a data signal Dj (see FIG. 3A) is provided to the reference node RD. At this time, the capacitor Cst stores the voltage corresponding to the data signal Dj.

When a fourth scan signal GWPi+1 applied to the i+1-th scan line SLi+1 of the first group SL-1 has the low level V-LOW, the seventh transistor T7 is turned on. As the seventh transistor T7 is turned on, the anode of the light emitting diode OLED is initialized to the initialization voltage Vint. A parasitic capacitor of the light emitting diode OLED may be discharged.

When the light emission control signal Ei has the low level V-LOW, the fifth transistor T5 and the sixth transistor T6 are turned on. When the fifth transistor T5 is turned on, the first power voltage ELVDD is provided to the first transistor T1. When the sixth transistor T6 is turned on, the first transistor T1 and the light emitting diode OLED are electrically connected. The light emitting diode OLED generates light of luminance in correspondence to the amount of current provided.

Figure 3C:
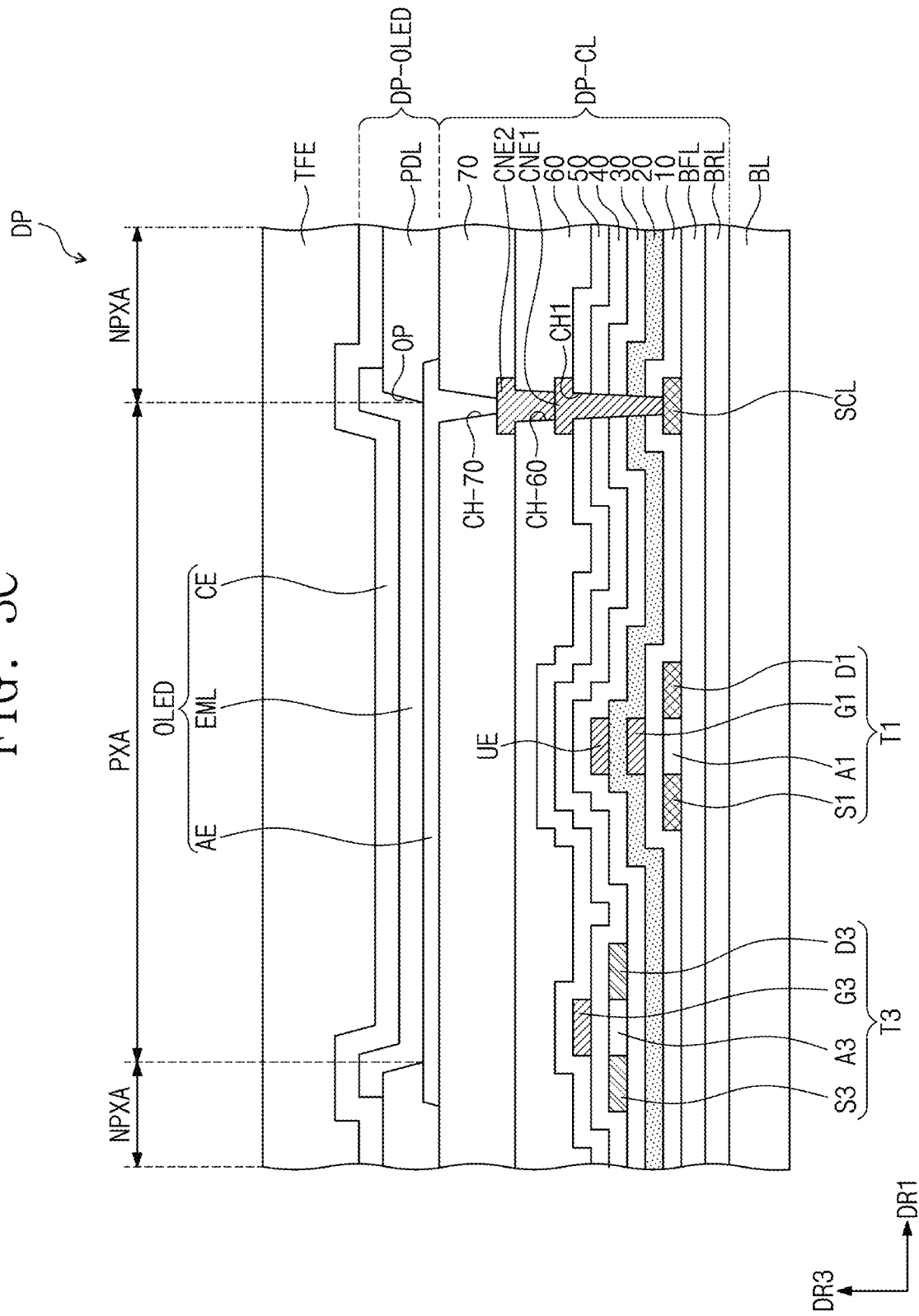
FIG. 3C is a cross-sectional view of a display panel according to an embodiment.

Referring to FIG. 3C, the display panel DP may include a base layer BL, a circuit is element layer DP-CL disposed on the base layer BL, a display element layer DP-OLED, and a thin film encapsulation layer. The display panel DP may further include functional layers such as a reflection prevention layer and a refractive index control layer. The circuit element layer DP-CL includes at least a plurality of insulation layers and a circuit element. Hereinafter, the insulation layers may include an organic layer and/or an inorganic layer.

An insulation layer, a semiconductor layer, and a conductive layer are formed by coating, deposition, and the like. Thereafter, the insulation layer, the semiconductor layer, and the conductive layer may be selectively patterned by photolithography. In this manner, a semiconductor pattern, a conductive pattern, a signal line, and the like are formed.

The base layer BL may include a synthetic resin film. The synthetic resin layer may include a thermosetting resin. Particularly, the synthetic resin layer may be a polyimide-based resin layer, and the material thereof is not particularly limited. At least one inorganic layer is formed on an upper surface of the base layer BL. The inorganic layer may be formed as a multi-layered inorganic layer. The multi-layered inorganic layers may constitute a barrier layer BRL and/or a buffer layer BFL to be described later in more detail. The barrier layer BRL and the buffer layer BFL may be selectively disposed.

The barrier layer BRL prevents foreign substances from being introduced from the outside. The buffer layer BFL may be disposed on the barrier layer BRL. The buffer layer BFL improves the coupling force between the base layer BL and the semiconductor pattern and/or the conductive pattern. The semiconductor pattern is disposed on the buffer layer BFL. Hereinafter, the semiconductor pattern directly disposed on the buffer layer BFL is defined as a first semiconductor pattern. The first semiconductor pattern may include a silicon semiconductor. The first semiconductor pattern may include polysilicon. However, the embodiment described herein is not limited thereto. The first semiconductor pattern may include amorphous silicon.

FIG. 3C illustrates only a portion of the first semiconductor pattern, and the first semiconductor pattern may further be disposed in a region for forming other transistors of the pixel PXij of FIG. 3A. The first semiconductor pattern has different electrical properties depending on whether the first semiconductor pattern is doped or not. The first semiconductor pattern may include a first region and a second region. The first region may be doped with an N-type dopant or a P-type dopant. A P-type transistor includes a doped region doped with the P-type dopant.

The first region has greater conductivity than the second region, and substantially serves as an electrode or a signal line. The second region substantially corresponds to an active region (or a channel) of a transistor. In other words, portions of the first semiconductor pattern having low conductivity may be actives of the transistor, and portions thereof having high conductivity may be sources, drains, or signal transmission regions (or signal transmission portions) of the transistor.

The source S1, an active region A1, and the drain D1 of the first transistor T1 are formed from the first semiconductor pattern. FIG. 3C illustrates a portion of a signal transmission region SCL formed from a semiconductor pattern. Although not separately illustrated, the signal transmission region SCL may be extended from the drain D6 of the sixth transistor T6 (see FIG. 3A).

A first insulation layer 10 is disposed on the buffer layer BFL. The first insulation layer 10 commonly overlaps the plurality of the pixels PX (see FIG. 2B), and covers the first semiconductor pattern. The first insulation layer 10 may be an inorganic layer and/or an organic layer, may have a single-layered or multi-layered structure, and may commonly overlap the plurality of pixels PX (see FIG. 2B). Not only the first insulation layer 10 but also an insulation layer of the circuit element layer DP-CL to be described layer may be an inorganic layer and/or an organic layer, and may have a single-layered or multi-layered structure.

On the first insulation layer 10, the gate G1 (hereinafter a first gate) of the first transistor T1 is disposed. The first gate G1 may be a portion of a metal pattern. The first gate G1 overlaps the active region A1 of the first transistor T1. In a process of doping the semiconductor pattern, the gate G1 is like a mask.

On the first insulation layer 10, a second insulation layer 20 which covers the first gate G1 is disposed. On the second insulation layer 20, an upper electrode UE may be disposed. The upper electrode UE may overlap the first gate G1. The upper electrode UE may be a portion of a metal pattern or a portion of a doped semiconductor pattern. A portion of the first gate G1 and the upper electrode UE overlapping the same may define the capacitor Cst (see FIG. 3A). In an embodiment, the upper electrode UE may be omitted.

On the first insulation layer 10, the first electrode Cst1 may be disposed. The first electrode Cst1 may be electrically connected the first gate G1. The first electrode Cst1 may have an integral shape with the first gate G1. On the second insulation layer 20, a second electrode (not shown) may be disposed. The second electrode may be electrically connected to the upper electrode UE. The second electrode Cst2 may have an integral shape with the upper electrode UE.

On the second insulation layer 20, a third insulation layer 30 which covers the upper electrode UE is disposed. Although not separately illustrated, the sources S2, S5, S6, and S7 (see FIG. 3A), the drains D2, D5, D6, and D7 (see FIG. 3A), and the gates G2, G5, G6, and G7 (see FIG. 3A) of the second, fifth, sixth, and seventh transistors T2, T5, T6, and T7 (see FIG. 3A) may respectively be formed through the same process as the source S1, the drain D1, and the gate G1 of the first transistor T1.

On the third insulation layer 30, a semiconductor pattern is disposed. Hereinafter, the semiconductor pattern directly disposed on the third insulation layer 30 is defined as a second semiconductor pattern. The second semiconductor pattern may include a metal oxide. An oxide semiconductor may include a crystalline or amorphous oxide semiconductor. For example, the oxide semiconductor may include a metal oxide of such as zinc (Zn), indium (In), gallium (Ga), tin (Sn), and titanium (Ti), or a mixture of a metal such as zinc (Zn), indium (In), gallium (Ga), tin (Sn), and titanium (Ti) and an oxide thereof. The oxide semiconductor may include an indium-tin oxide (ITO), an indium-gallium-zinc oxide (IGZO), a zinc oxide (ZnO), an indium-zinc oxide (IZnO), a zinc-indium oxide (ZIO), an indium oxide (InO), a titanium oxide (TiO), an indium-zinc-tin oxide (IZTO), a zinc-tin oxide (ZTO), and the like.

FIG. 3C illustrates only a portion of the second semiconductor pattern, and when viewed on a plane, the second semiconductor pattern may further be disposed in a region for forming other transistors of the pixel PXij illustrated in FIG. 3A. The second semiconductor pattern may include a plurality of regions distinguished according to whether a metal oxide has been reduced or not. A region in which a metal oxide is reduced (hereinafter, a reduction region) has greater conductivity than a region in which a metal oxide is not reduced (hereinafter, a non-reduction region). The reduction region substantially serves as an electrode or a signal line. The non-reduction region substantially corresponds to an active region (or a channel) of a transistor. In other words, a portion of the second semiconductor pattern may be an active region of a transistor, another portion thereof may be a source or a drain of the transistor, and the other portion thereof may be a connection electrode or a connection signal line.

As illustrated in FIG. 3C, the source S3, an active region A3, and the drain D3 of the first transistor T3 are formed from the second semiconductor pattern. The source S3 and the drain D3 include a metal reduced from a metal oxide semiconductor. The source S3 and the drain D3 has a predetermined thickness from an upper surface of the second semiconductor pattern, and may include a metal layer including the reduced metal.

On the third insulation layer 30, a fourth insulation layer 40 which covers the second semiconductor pattern is disposed. On the fourth insulation layer 40, the gate G3 (hereinafter a third gate) of the third transistor T3 is disposed. The third gate G3 may be a portion of a metal pattern. The third gate G3 overlaps the active region A3 of the third transistor T3.

On the fourth insulation layer 40, a fifth insulation layer 50 which covers the third gate G3 is disposed. Although not separately illustrated, the source S4 (see FIG. 3A), the drain D4 (see FIG. 3A), and the gate G4 (see FIG. 3A) of the fourth transistor T4 (see FIG. 3A) may be respectively formed through the same process as the source S3, the drain D3, and the gate G3 of the third transistor T3.

On the fifth insulation layer 50, at least one insulation layer is further disposed. As described in the embodiment, a sixth insulation layer 60 and a seventh insulation layer 70 may be disposed on the fifth insulation layer 50. The sixth insulation layer 60 and the seventh insulation layer 70 may each be an organic layer, and may each have a single-layered structure or a multi-layered structure. The sixth insulation layer 60 and the seventh insulation layer 70 may each be a single-layered polyimide-based resin layer.

As illustrated in FIG. 3C, on the fifth insulation layer 50, a first connection electrode CNE10 may be disposed. The first connection electrode CNE10 may be connected to the signal transmission region SCL through a contact hole CH1 passing through the first to fifth insulation layers 10 to 50, and a second connection electrode CNE20 may be connected to the first connection electrode CNE10 through a contact hole CH-60 passing through the sixth insulation layer 60. On the seventh insulation layer 70, the light emitting diode OLED is disposed. A first electrode AE of the light emitting diode OLED is disposed on the seventh insulation layer 70. On the seventh insulation layer 70, a pixel definition film PDL is disposed. The first electrode AE is connected to the first connection electrode CNE10 through a contact hole CH-70 passing through the seventh insulation layer 70.

An opening OP of the pixel definition film PDL exposes at least a portion of the first electrode AE. The opening OP of the pixel definition film PDL may define a light emitting region PXA. The light emitting layer EML may be disposed only in a region corresponding to the opening OP. Although the light emitting layer EML which has been subjected to patterning is illustrated in the embodiment described herein, the light emitting layer EML may be commonly disposed in the plurality of pixels PX. The commonly disposed light emitting layer EML may generate white light or blue light. In addition, the light emitting layer EML may have a multi-layered structure.

The plurality of pixels PX (see FIG. 3A) may be disposed according to a predetermined rule on a plane of the display panel DP (see FIG. 2B). At least one of a hole transport layer, a hole injection layer, an electron transport layer, or an electron injection layer may be commonly disposed in the light emitting region PXA and a non-light emitting region NPXA.

In the embodiment described herein, the thin film encapsulation layer TFE may directly cover a second electrode CE. The thin film encapsulation layer TFE is commonly disposed in the plurality of pixels PX. Between the second electrode CE and the thin film encapsulation layer TFE, or on the thin film encapsulation layer TFE, an additional insulation layer may be further disposed.

Figure 4A:
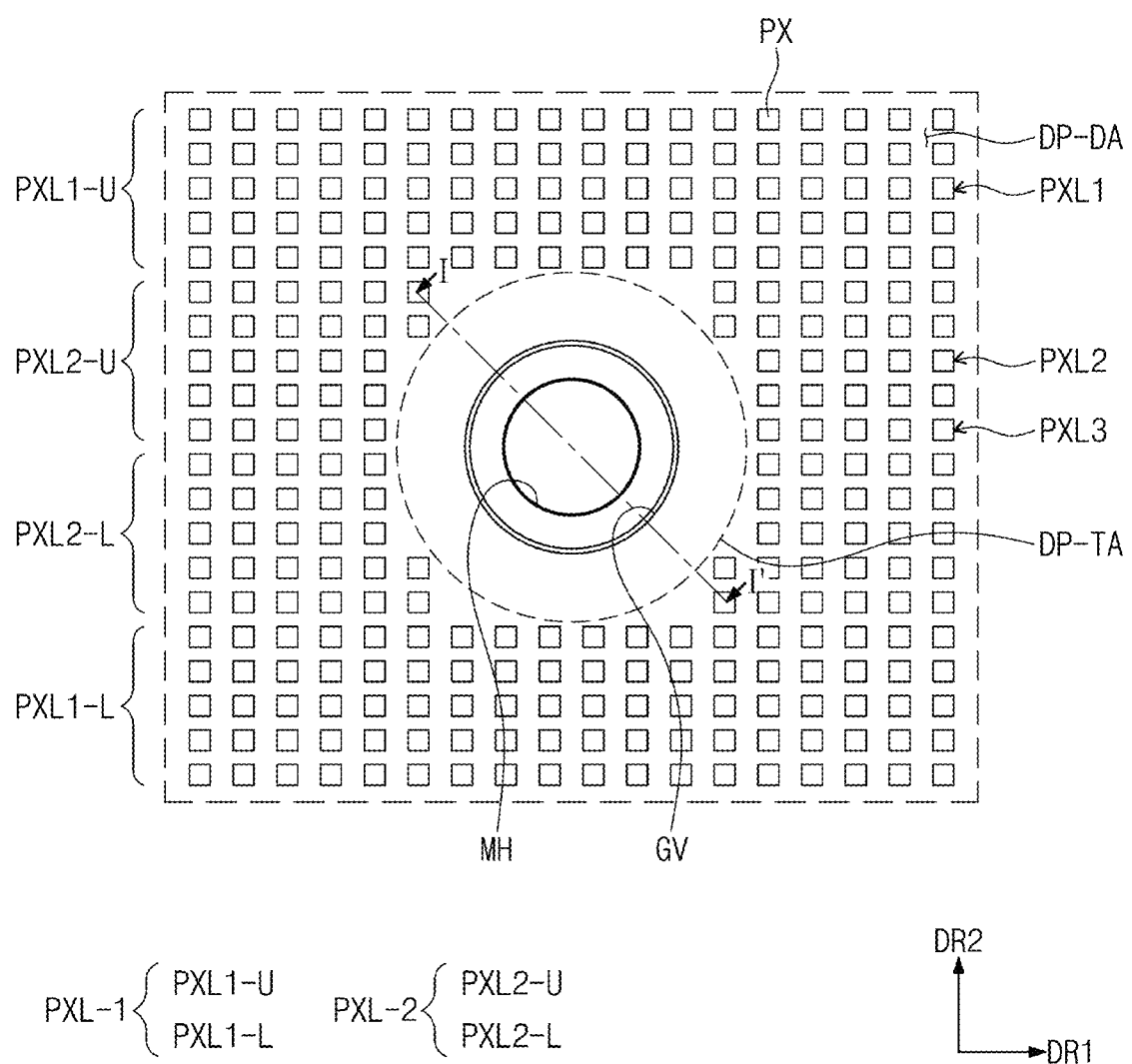
FIG. 4A is a plan view of an enlarged region of a display panel according to an embodiment.
Figure 4B:
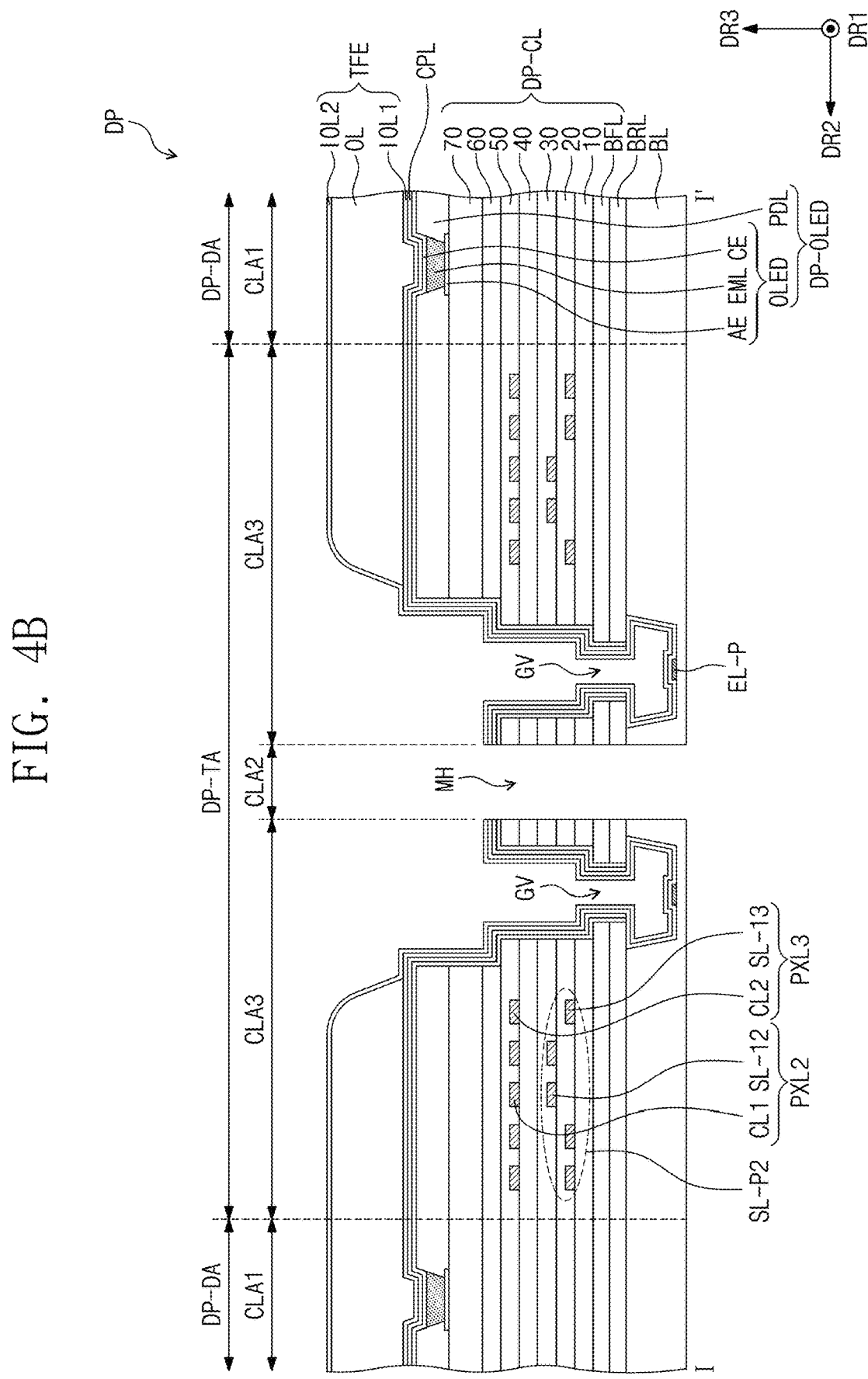
FIG. 4B is a cross-sectional view corresponding to line I-I' of FIG. 4A and FIG. 4D.
Figure 4C:
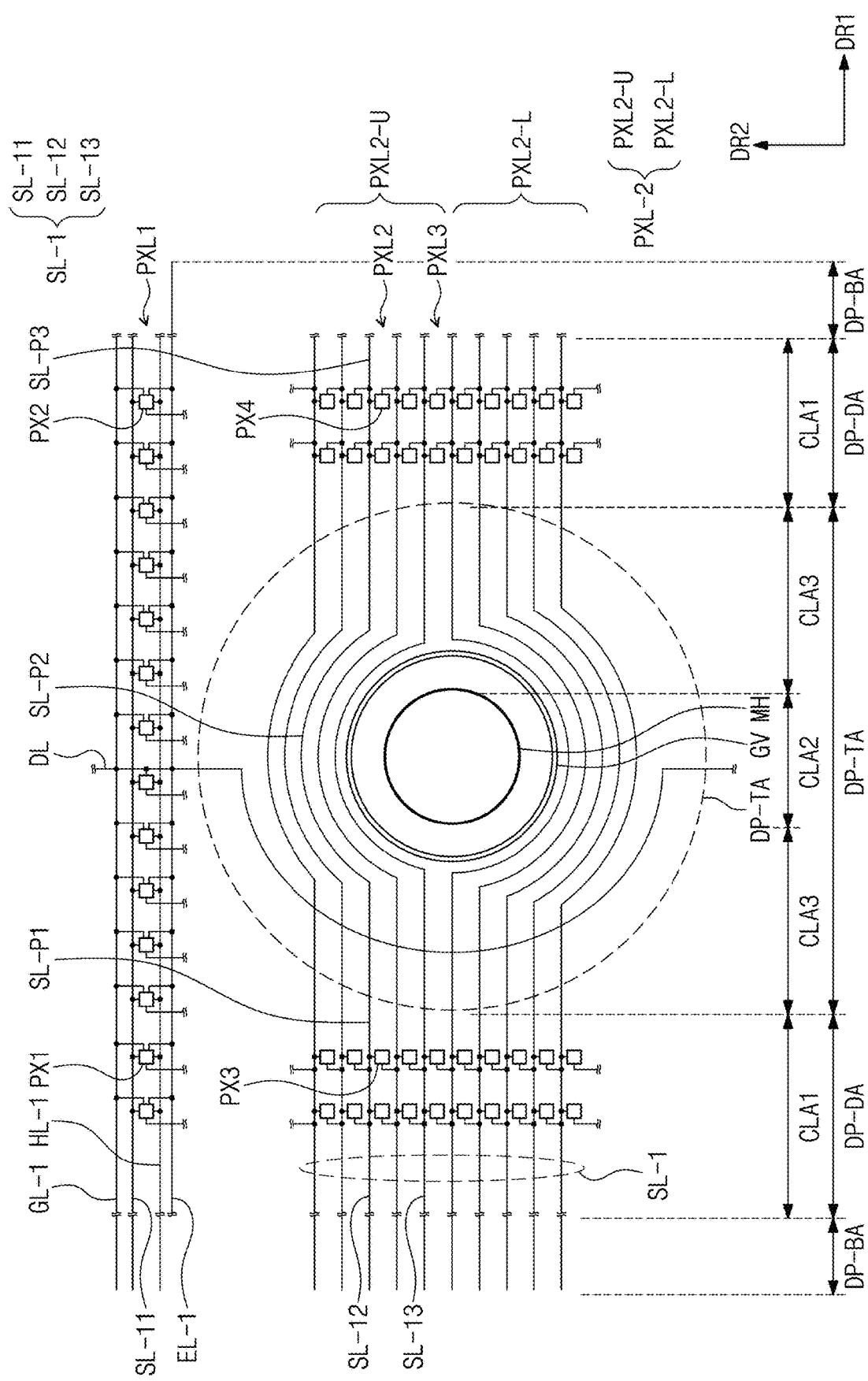
FIG. 4C is a plan view illustrating a signal line and a pixel disposed around a pixel row disconnection region of a display panel according to a comparative example.
Figure 4D:
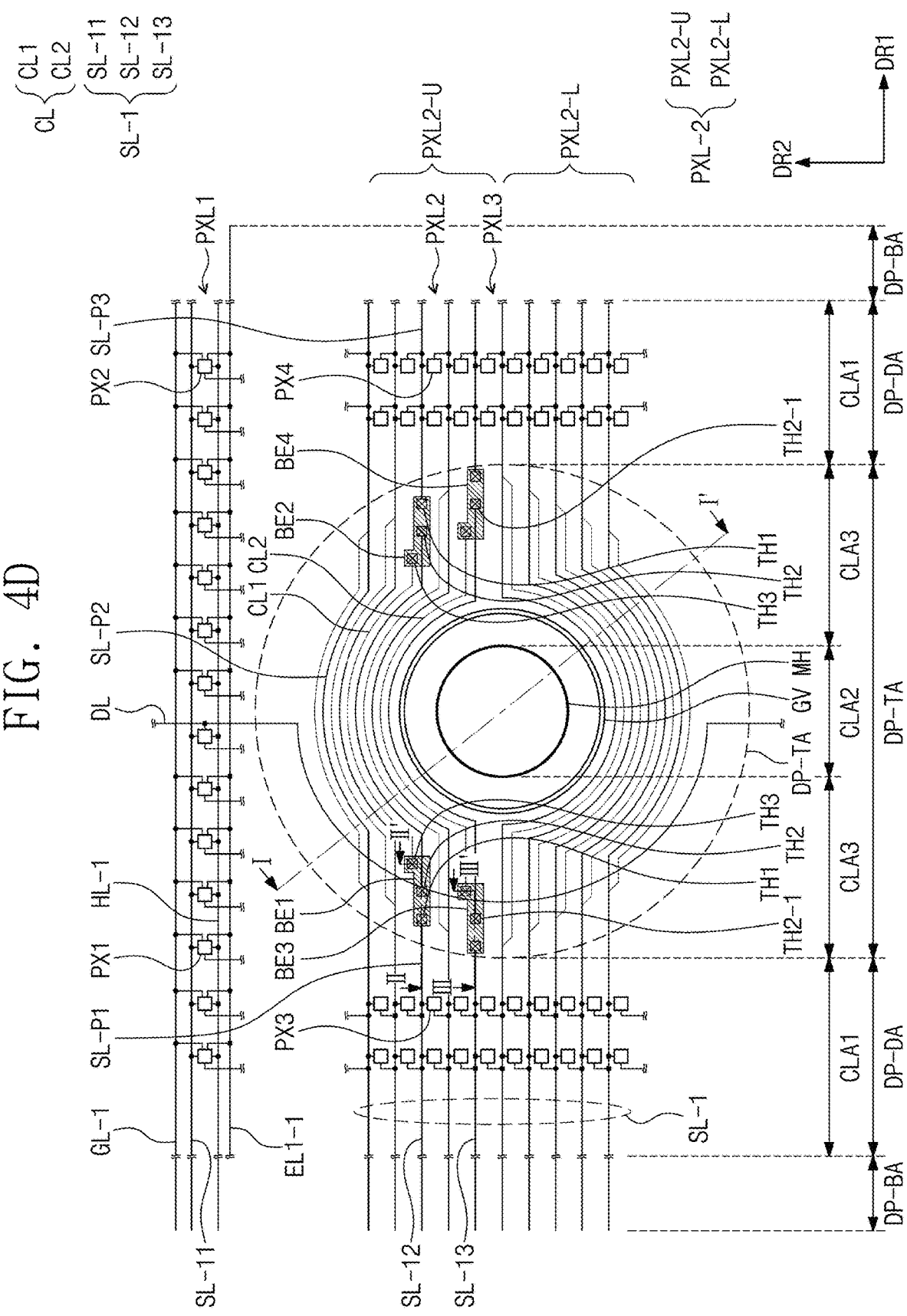
FIG. 4D is a plan view illustrating a signal line and a pixel disposed around a pixel row disconnection region of a display panel according to an embodiment.
Figure 4E:
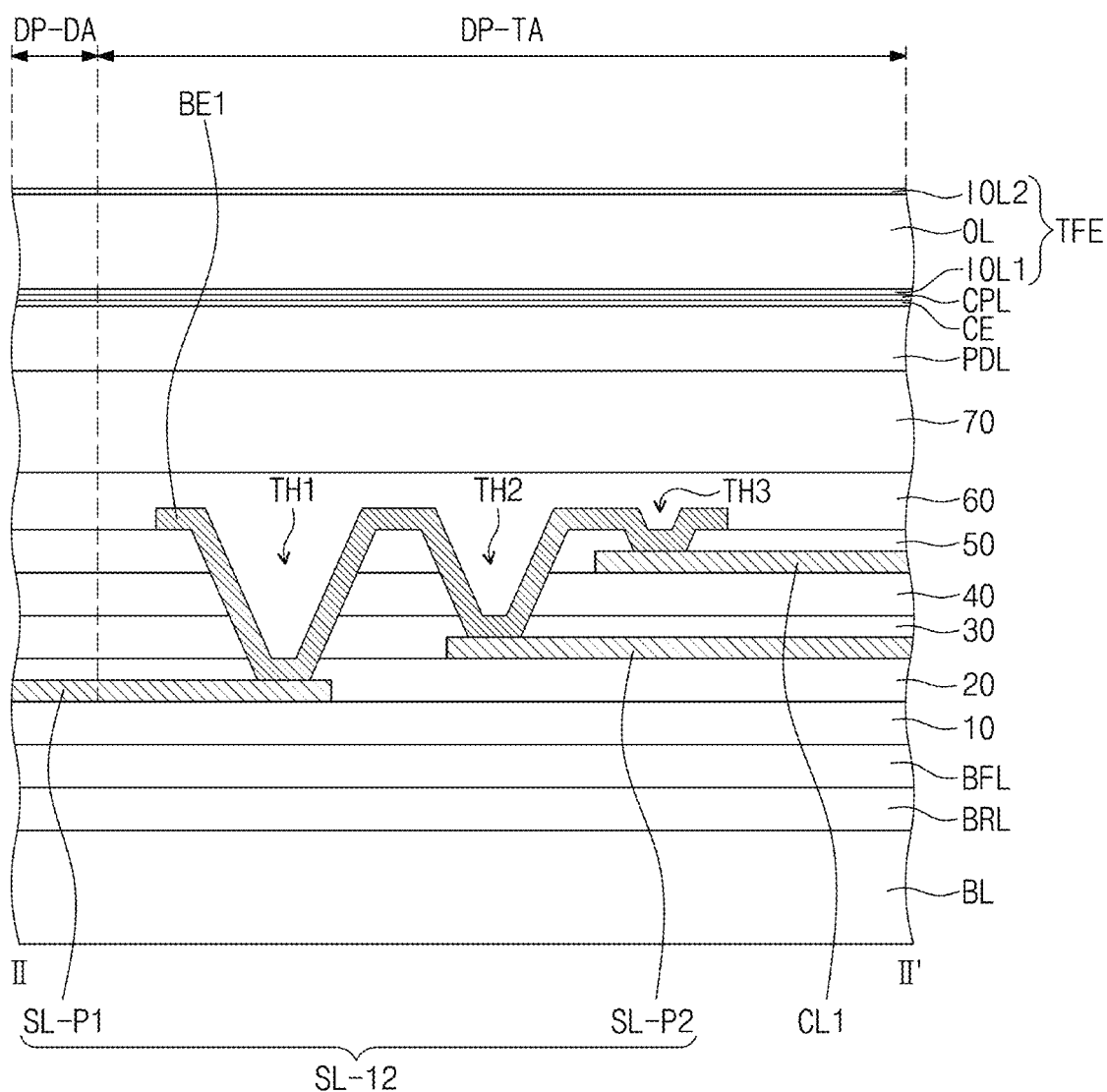
FIG. 4E is a cross-sectional view corresponding to line II-IF of FIG. 4D.
Figure 4F:
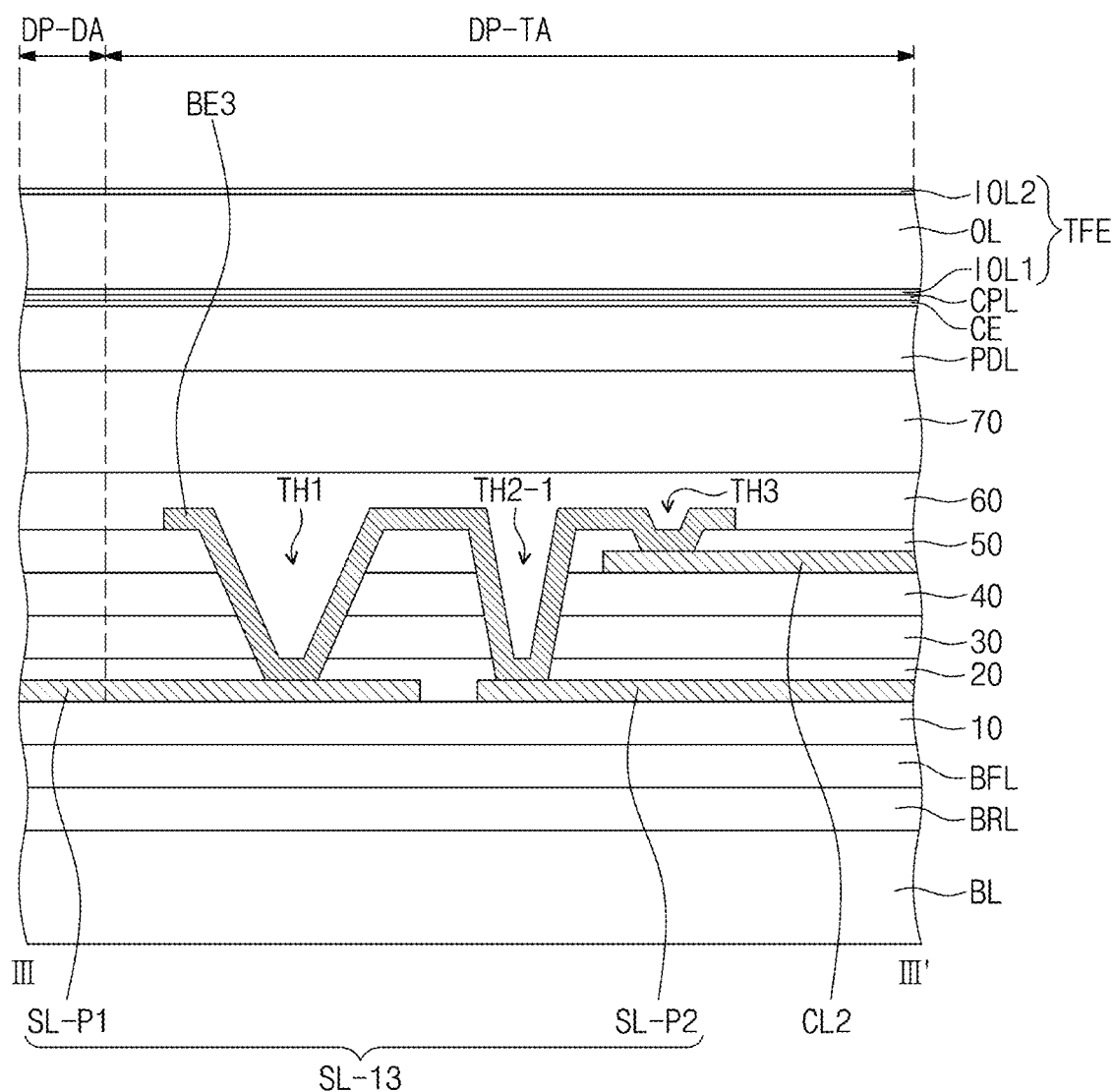
FIG. 4F is a cross-sectional view corresponding to line of FIG. 4D.
Figure 4G:
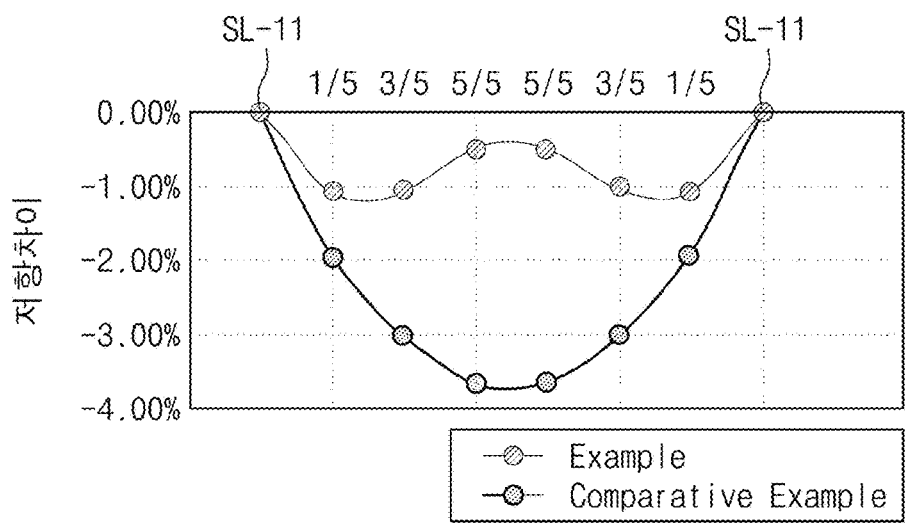
FIG. 4G is a graph comparing resistance of scan lines according to a comparative example and resistance of scan lines according to an embodiment.
Figure 4H:
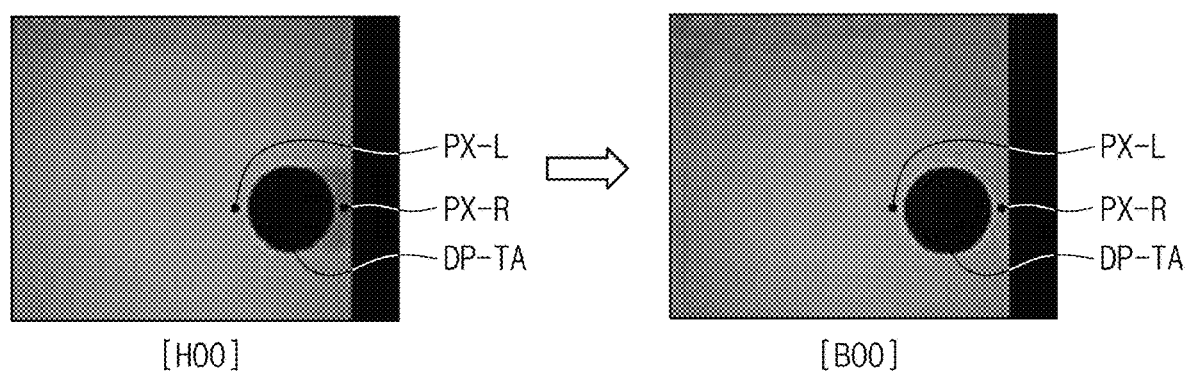
FIG. 4H is a photograph comparing a green image displayed in a display panel according to a comparative example and a green image displayed in a display panel according to an embodiment.
Figure 4I:
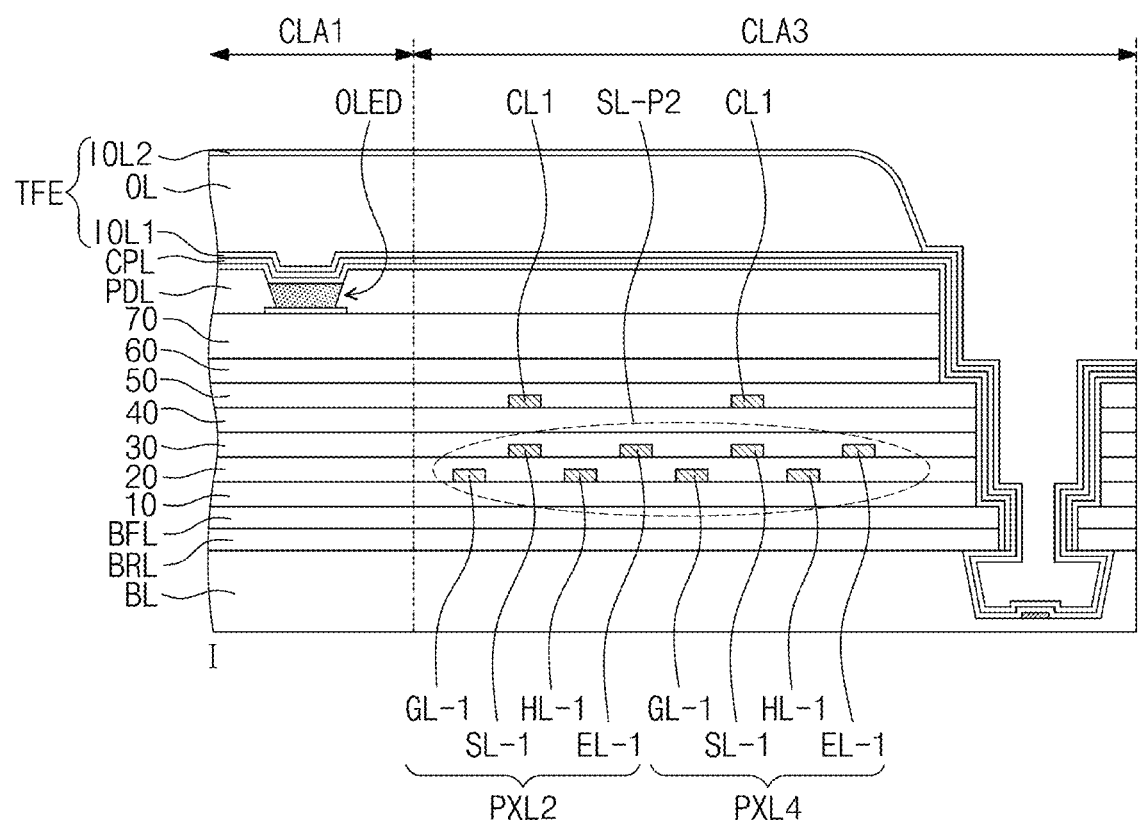
FIG. 4I is a cross-sectional view illustrating stacking positions of a scan line of a first group, a scan line of a second group, a scan line of a third group, and a light emission line.

FIG. 4A is a plan view of an enlarged region of the display panel DP according to an embodiment. FIG. 4B is a cross-sectional view corresponding to line I-I' of FIG. 4A and FIG. 4D. FIG. 4C is a plan view illustrating a signal line and the pixel PX disposed around the pixel row disconnection region DP-TA of the display panel DP according to a comparative example. FIG. 4D is a plan view illustrating a signal line and the pixel PX disposed around the pixel row disconnection region DP-TA of a display panel according to an embodiment of the inventive concepts. FIG. 4E is a cross-sectional view corresponding to line II-IF of FIG. 4D. FIG. 4F is a cross-sectional view corresponding to line of FIG. 4D. FIG. 4G is a graph comparing resistance of scan lines according to a comparative example and resistance of scan lines according to an embodiment of the inventive concepts. FIG. 4H is a photograph comparing a green colored image displayed in the display panel DP according to a comparative example and a green colored image displayed in a display panel according to an embodiment of the inventive concepts. FIG. 4I is a cross-sectional view illustrating stacking positions of a scan line of a first group, a scan line of a second group, a scan line of a third group, and a light emission line.

FIG. 4A illustrates only some of a plurality of pixel rows illustrated in FIG. 2A. Ten pixel rows PXL-1 (hereinafter, a first group) disposed in the first region DP-DA and not disconnected by the second region DP-TA, and ten pixel rows PXL-2 (hereinafter, a second group) disconnected by the second region DP-TA among the plurality of pixel rows are illustrated. In the second direction DR2, five pixel rows (hereinafter, pixel rows on one side PXL1-U of the first group PXL-1) among the pixel rows of the first group PXL-1 are disposed on one side of the second region DP-TA, and the remaining five pixel rows (hereinafter, pixel rows on the other side PXL1-L of the first group PXL-1) among the pixel rows of the first group PXL-1 are disposed on the other side of the second region DP-TA. Among the pixel rows of the second group PXL-2, five pixel rows adjacent to the pixel rows on one side PXL1-U of the first group PXL-1 are defined as pixel rows on one side PXL2-U of the second group PXL-2, and among the pixel rows of the second group PXL-2, the remaining five pixel rows adjacent to the pixel rows on the other side PXL1-L of the first group PXL-1 are defined as pixel rows on one side PXL2-L of the second group PXL-2.

One pixel row among the pixel rows on one side PXL1-U of the first group PXL-1 is defined as a first pixel row PXL1, and two pixel rows spaced apart in the second direction DR2 among the pixel rows on one side PXL2-U of the second group PXL-2 are defined as a second pixel row PXL2 and a third pixel row PXL3, respectively. Hereinafter, the first pixel row PXL1, the second pixel row PXL2, and the third pixel row PXL3 will be mainly described.

The number of pixels PX disposed in each of the first pixel row PXL1, the second pixel row PXL2, and the third pixel row PXL3 may be different. However, connection relationships between the pixels PX disposed in the first pixel row PXL1, the second pixel row PXL2, and the third pixel row PXL3 and signal lines correspondingly disposed in the first pixel row PXL1, the second pixel row PXL2, and the third pixel row PXL3 are the same. The connection relationship between pixels and signal lines has been described in detail with reference to the equivalent circuit of the pixel PXij of FIG. 3A, a redundant description will be omitted for sake of brevity.

Referring to FIG. 4B, in the embodiment, a module hole MH may be defined inside of the second region DP-TA. An opening area passing through from a lower surface of the display panel DP to an upper surface of the display panel DP corresponds to the module hole MH.

In FIG. 4B, the thin film encapsulation layer TFE is illustrated in detail, and a capping layer CPL is additionally illustrated. The thin film encapsulation layer TFE is may include a first inorganic layer IOL1, an organic layer OL, and a second inorganic layer IOL2. The capping layer CPL is disposed on the second electrode CE and comes in contact with the second electrode CE. The capping layer CPL may include an organic material. In the embodiment, a lower surface of the base layer BL corresponds to the lower surface of the display panel DP, and an upper surface of the second inorganic layer IOL2 corresponds to the upper surface of the display panel DP.

A recessed pattern GV may be disposed around the module hole MH. Unlike the module hole MH, the recessed pattern GV does not pass through the display panel DP. The recessed patterns GV may be defined along the edge of the module hole MH. In the embodiment, the recessed pattern GV is illustrated as a closed line surrounding the module hole MH, and illustrated in a circle shape which is similar to the shape of the module hole MH.

The recessed pattern GV may pass through the circuit element layer DP-CL and may be extended to a groove formed in the base layer BL. A deposition pattern EL-P may be disposed inside the recessed pattern GV. The deposition pattern EL-P is formed by stacking a deposition material in the groove of the base layer BL in a deposition process of the light emitting diode OLED.

FIG. 4B illustrates a first region CLA1, a second region CLA2, and a third region CLA3 of the circuit element layer DP-CL. The first region CLA1 of the circuit element layer DP-CL corresponds to the above-described first region DP-DA, the second region CLA2, and the third region CLA3 of the circuit element layer DP-CL correspond to the above-described second region DP-TA.

The second region CLA2 of the circuit element layer DP-CL has a higher transmittance of an optical signal than the third region CLA3 of the circuit element layer DP-CL. The second region CLA2 of the circuit element layer DP-CL may be a signal transmission region through which an optical signal is transmitted, and the third region CLA3 of the circuit element layer DP-CL may be a wiring region. In the embodiment described herein, the second region CLA2 may be an opening area corresponding to the module hole MH. In the third region CLA3, a signal line to be described later in more detail may be disposed.

In each of FIG. 4C and FIG. 4D, the pixel rows of the second group PXL-2 including the first pixel row PXL1 and the second pixel row PXL2 and the third pixel row PXL3 described with reference to FIG. 4A are illustrated. The second pixel row PXL2 and the third pixel row PXL3 are respectively defined as a pixel row disposed third and a pixel row disposed fifth in the second direction DR2 among the pixel rows on one side PXL2-U of the second group PXL-2.

Referring to FIG. 4C and FIG. 4D, among the scan lines SL1 to SLm (see FIG. 2B) of the first group SL-1, scan lines corresponding to pixel rows of the first pixel row PXL1 and the second group PXL-2 are illustrated. Scan lines of the first group SL-1 electrically connected to the first pixel row PXL1, the second pixel row PXL2, and the third pixel row PXL3, respectively, may be defined as a first scan line SL-11, a second scan line SL-12, and a third scan lie SL-13. Here, "a pixel row or a pixel column is electrically connected to a signal line (e.g., a scan line)" connotes that "a pixel driving circuit included in a pixel row or in a pixel column is connected to a signal line".

Among pixels connected to the first scan line SL-11, pixels connected to the second scan line SL-12, and pixels connected to the third scan line SL-13, pixels corresponding to each other are disposed in the same pixel column. For example, the leftmost pixel column illustrated in FIG. 4C includes a pixel connected to one first scan line SL-11, a pixel connected to one second scan line SL-12, and a pixel connected to one third scan line SL-13.

A first pixel PX1 connected to the first scan line SL-11 is disposed on one side of the second region DP-TA in the first direction DR1, and a second pixel PX2 is disposed on the other side of the second region DP-TA in the first direction DR1. A third pixel PX3 connected to the second scan line SL-12 is disposed on one side of the second region DP-TA in the first direction DR1, and a fourth pixel PX4 is disposed on the other side of the second region DP-TA in the first direction DR1. The first pixel PX1 and the third pixel PX3 are disposed in the same pixel column, and the second pixel PX2 and the fourth pixel PX4 are disposed in the same pixel column. The first pixel PX1 and the third pixel PX3 are arranged in the second direction DR2, and the second pixel PX2 and the fourth pixel PX4 are arranged in the second direction DR2.

In FIG. 4C and FIG. 4D, a scan line of a second group GL-1, a scan line of a third group HL-1, and a light emission line EL-1 which are corresponding to the first pixel row PXL1 are additionally illustrated. The scan line of the second group GL-1 and the scan line of the third group HL-1 respectively correspond to the i-th scan line GLi of the second group and the i-th scan line HLi of the third group, which are illustrated in FIG. 3A. Although not separately illustrated for convenience of description, the scan line of the second group GL-1, the scan line of the third group HL-1, and the light emission line EL-1 may be disposed to correspond to each of the pixel rows of the second group PXL-2.

Each of the first pixel row PXL1, the second pixel row PXL2, and the third pixel row PXL3 is connected to a scan line of the first group SL-1 of an immediately following pixel row, and may receive the same signal as the scan line of the first group SL-1 of the immediately following pixel row. It can be seen that the pixel PXij connected to the i-th scan line SLi through the second transistor T2 is connected to the i+1-th scan line SLi+1, which is a scan line of an immediately following pixel row, through the seventh transistor T7.

In the first region CLA1, some of the scan line of the first group SL-1, the scan line of the second group GL-1, the scan line of the third group HL-1, and the light emission line EL-1 are disposed on the same layer, and others may be disposed on different layers from each other. For example, the scan line of the first group SL-1 and the light emission line EL-1 may be disposed on the same layer as the first gate G1 in FIG. 3C. The scan line of the second group GL-1 and the scan line HL-1 of the third group HL-1 may be disposed on the same layer as the third gate G3 in FIG. 3C.

The stacking positions of some signal lines not illustrated in FIG. 4C and FIG. 4D may be briefly described as follows. The first voltage line PL (see FIG. 2B) extended in the second direction DR2 may be disposed, in the first region CLA1, on the same layer as the first connection electrode CNE10 of FIG. 3C. The data line DL extended in the second direction DR2 may be disposed, in the first region CLA1, on the same layer as the second connection electrode CNE20 of FIG. 3C. In addition, the second voltage line RL extended in the first direction DR1 may be disposed, in the first region CLA1, on as a same layer as the upper electrode UE of FIG. 3C.

Referring back to FIG. 4 and FIG. 4D, the third scan line SL-13 is longer than the first scan line SL-11 and the second scan line SL-12, and the second scan line SL-12 is longer than the first scan line SL-11. The length of each of the first scan line SL-11, the second scan line SL-12, and the third scan line SL-13 is measured from one end to the other end in the first direction DR1. The one end is connected to the scan driver SDV illustrated in FIG. 2B. The other ends the first scan line SL-11, the second scan line SL-12, and the third scan line SL-13 are arranged in the second direction DR2, and the difference in length of each of the first scan line SL-11, the second scan line SL-12, and the third scan line SL-13 is determined by the presence of portions disposed in the second region DP-TA and the difference in length of the portions disposed in the second region DP-TA.

Since the first scan line SL-11 is not disposed in the second region DP-TA, the first scan line SL-11 is the shortest of the three scan lines, and since a portion of the third scan line SL-13 disposed in the second region DP-TA is longer than a portion of the second scan line SL-12 disposed therein, the third scan line SL-13 is the longest of the three scan lines. In addition, the further scan lines corresponding to the pixel rows on one side PXL2-U of the second group PXL-2 are disposed from the first scan line SL-11, the longer the scan lines are, and the further scan lines corresponding to the pixel rows on the other side PXL2-L of the second group PXL-2 are disposed from the first scan line SL-11, the shorter the scan lines are.

Referring to FIG. 4D, each of the scan lines of the first group SL-1 corresponding to the pixel rows of the second group PXL-2 may include a plurality of portions spaced apart from each other. Each of the scan lines of the first group SL-1 corresponding to the pixel rows of the second group PXL-2 may include a first portion SL-P1 disposed on one side of the second region DP-TA in the first direction DR1, a third portion SL-P3 disposed on the other side of the second region DP-TA in the first direction DR1, and a second portion SL-P2 disposed in the second region DP-TA.

The first portion SL-P1 and the third portion SL-P3 of some scan lines are disposed on the same layer, and the second portion SL-P2 thereof may be disposed on a different layer from the first portion SL-P1 and the third portion SL-P3. The first portion SL-P1 and the third portion SL-P3 may be disposed on the same layer as the first gate G1 (see FIG. 3C). The first portion SL-P1, the second portion SL-P2, and the third portion SL-P3 of other scan lines may be disposed on the same layer. As scan lines include a plurality of separated portions, and are electrically connected through a bridge electrode as to be described later, disconnection defects caused by static electricity may be suppressed. The second scan line SL-12 and the third scan line SL-13 will be described in more detail later.

Since the second portion SL-P2 bypasses the module hole MH, the scan lines of the first group SL-1 corresponding to the pixel rows of the second group PXL-2 are longer than the first scan line SL-11. As illustrated in FIG. 4D, the second portion SL-P2 may have a curved shape, but the shape of the second portion SL-P2 is not particularly limited.

Scan lines of a second group, scan lines of a third group, and light emission lines, all of which are corresponding to the pixel rows of the second group PXL-2 and not illustrated in FIG. 4C and FIG. 4D, have a similar shape to that of the scan lines of the first group SL-1, and may include a curved portion. A change in length of the scan lines of the second group, the scan lines of the third group, and the light emission lines, all of which are corresponding to the pixel rows of the second group PXL-2, may correspond to a change in length of the scan lines of the first group SL-1 which are corresponding to the pixel rows of the second group PXL-2. In addition, by the same rules applied to the scan lines of the first group SL-1, a compensation line may be electrically connected to the scan lines of the second group, the scan lines of the third group, and the light emission lines. Hereinafter, the scan lines of the first group SL-1 will be mainly described.

Referring to FIG. 4C, integrated scan lines of the first group SL-1 disposed on one layer are illustrated. Each of the scan lines of the first group SL-1 illustrated in FIG. 4C may be disposed on the same layer as the first gate G1 of FIG. 3C.

FIG. 4G shows the resistance difference for the first scan line SL-11 of the scan lines of the first group SL-1 corresponding to the pixel rows of the second group PXL-2 according to a comparative example illustrated in in FIG. 4C. Referring to the graph according to a comparative Example of FIG. 4G, it can be seen that the longer the scan line, the bigger the resistance.

Referring to FIG. 4D, compensation lines CL electrically connect a first point and a second point of each of the scan lines of the first group SL-1 corresponding to the pixel rows of the second group PXL-2. The first point may be disposed on the left side of the module hole MH, and the second point may be disposed on the right side of the module hole MH. A position at which a first bridge electrode BE1 to be described layer is disposed may correspond to a first point of the second scan line SL-12, and a position at which a second bridge electrode BE2 is disposed may correspond to a second point of the second scan line SL-12. A position at which a third bridge electrode BE3 is disposed may correspond to a first point of the third scan line SL-13, and a position at which a fourth bridge electrode BE4 is disposed may correspond to a second point of the third scan line SL-13.

In order to distinguish the compensation lines CL and the scan lines of the first group SL-1 corresponding thereto, FIG. 4D illustrate the same spaced apart from each other on a plane. However, the compensation lines CL and the scan lines of the first group SL-1 corresponding thereto may overlap each other. A compensation line CL includes a portion corresponding to the second portion SL-P2 of a scan line. That is, the compensation line CL may include a portion having a curved shape.

Among the compensation lines CL, a line electrically connected to the second scan line SL-12 is defined as a first compensation line CL1, and a line electrically connected to the third scan line SL-13 is defined as a second compensation line CL2. On a plane, the second compensation line CL2 is longer than the first compensation line CL1. The longer the scan lines of the first group SL-1, the longer the compensation lines to be connected thereto.

The compensation lines CL may be disposed on a different layer from the scan lines of the first group SL-1. As illustrated in FIG. 4E, the first compensation line CL1 is disposed on a different layer from the first portion SL-P1 and the second portion SL-P2 of the second scan line SL-12. As illustrated in FIG. 4F, the second compensation line CL2 is disposed on a different layer from the first portion SL-P1 and the second portion SL-P2 of the third scan line SL-13. Referring to FIG. 4E and FIG. 4F, it can be seen that an end region of the first portion SL-P1 of the second line SL-12 and an end region of the first portion SL-P1 of the third scan line SL-13 extend to the second region DP-TA.

Referring to FIG. 4B, FIG. 4E, and FIG. 4F, the second portion SL-P2 of the second scan line SL-12 is disposed on the second insulation layer 20, and the second portion SL-P2 of the third scan line SL-13 is disposed on the first insulation layer 10. The second portions SL-P2 of the scan lines of the first group SL-1 corresponding the pixel rows of the second group PXL-2 may be grouped into two and disposed on a different layer from each other. When the second portions SL-P2 are disposed on different layer by a specific unit, process failure may decrease and a line width may be bigger. The first compensation line CL1 and the second compensation line CL2 may be disposed on the fourth insulation layer 40 in the same manner as the third gate G3 (see FIG. 3C).

First to fourth bridge electrodes BE1, BE2, BE3, and BE4 connect the first portion SL-P1, the second portion SL-P2, the third portion SL-P3, and a compensation line of each of the scan lines of the first group SL-1 corresponding to the pixel rows of the second group PXL-2.

Referring to FIG. 4B, FIG. 4D, and FIG. 4E, the first bridge electrode BE1 electrically connects the first portion SL-P1, the second portion SL-P2, and the first compensation line CL1 of the second scan line SL-12, and the second bridge electrode BE2 electrically connects the second portion SL-P2, the third portion SL-P3, and the first compensation line CL1 of the second scan line SL-12. The first bridge electrode BE1 and the second bridge electrode BE2 are disposed on the fifth insulation layer 50. The first bridge electrode BE1 and the second bridge electrode BE2 are provided through the same process as the first connection electrode CNE10 illustrated in FIG. 3C.

As illustrated in FIG. 4E, the first bridge electrode BE1 is connected to the first portion SL-P1 through a first contact hole TH1 passing through the second to fifth insulation layers 20 to 50. The first connection electrode BE1 is connected to the second portion SL-P2 through a second contact hole TH2 passing through the third to fifth insulation layers 30 to 50. The first bridge electrode BE1 is connected to the first compensation line CL1 through a third contact hole TH3 passing through the fifth insulation layer 50.

In an embodiment, the first contact hole TH1 may be disposed in the first region DP-DA, not the second region DP-TA. At this time, an end of the first portion SL-P1 may be disposed in the first region DP-DA.

A structure of connecting the first portion SL-P1, the second portion SL-P2, and the first compensation line CL1 and a structure of connecting the second portion SL-P2, the third portion SL-P3, and the first compensation line CL1 through one bridge electrode BE1 or BE2 are shown, but the structure of the bridge electrode BE1 or BE2 is not limited thereto.

In an embodiment, a bridge electrode may connect only the first portion SL-P1 and the second portion SL-P2, and the first compensation line CL1 may be directly connected to the second portion SL-P2 through a contact hole. In an embodiment of the inventive concepts, a bridge electrode may be omitted. The second portion SL-P2 may be directly connected to the first portion SL-P1 through a contact hole, and the first compensation line CL1 may be directly connected to the second portion SL-P2 through a contact hole.

The second bridge electrode BE2 has a similar structure to that of the first bridge electrode BE1, and electrically connects the second portion SL-P2, the third portion SL-P3, and the first compensation line CL1 of the second scan line SL-12. Therefore, a detailed description thereof will be omitted for sake of brevity.

Referring to FIG. 4B, FIG. 4D, and FIG. 4F, the third bridge electrode BE3 electrically connects the first portion SL-P1, the second portion SL-P2, and the second compensation line CL2 of the third scan line SL-13, and the fourth bridge electrode BE4 electrically connects the second portion SL-P2, the third portion SL-P3, and the second compensation line CL2 of the third scan line SL-13.

As illustrated in FIG. 4F, the third bridge electrode BE3 is connected to the first portion SL-P1 through the first contact hole TH1 passing through the second to fifth insulation layers 20 to 50. The third connection electrode BE3 is connected to the second portion SL-P2 through a second contact hole TH2-1 passing through the second to fifth insulation layers 20 to 50. The third bridge electrode BE3 is connected to the second compensation line CL2 through the third contact hole TH3 passing through the fifth insulation layer 50. Since the first portion SL-P1 and the second portion SL-P2 are disposed on the same layer, the second contact hole TH2-1 substantially corresponds to the same contact hole as the first contact hole TH1.

In an embodiment, the first portion SL-P1 and the second portion SL-P2 of the third scan line SL-13 may have an integral shape. Any one of the first contact hole TH1 and the second contact hole TH2-1 may be omitted. In addition, the second portion SL-P2 and the third portion SL-P3 of the third scan line SL-13 may have an integral shape.

The compensation lines CL decrease the resistance of the scan lines of the first group SL-1. The compensation lines CL1 and CL2 and the scan lines SL-12 and SL-13 connected thereto may be defined as electrically one signal line, and combined resistance of the compensation lines CL1 and CL2 and the scan lines SL-12 and SL-13 is smaller than resistance of the scan lines SL-12 and SL-13. This can be seen by referring to the graph according to an embodiment of FIG. 4G. It can be seen that the difference between combined resistance of each of the scan lines of the first group SL-1 corresponding to the pixel rows of the second group PXL-2 and resistance of the first scan line SL-11 is decreased compared to a comparative example. An effect which may be obtained due to the decrease in difference between combined resistance of a scan line of the first group SL-1 and resistance of the first scan lines SL-11 will be described with reference to FIG. 4H.

A photograph H00 on the left side of FIG. 4H is a green colored image displayed on the display panel DP according to a comparative example illustrated in FIG. 4C. It can be seen that luminance of a right-side region of an image is lower than that of a left-side region thereof around the second region DP-TA. Referring to FIG. 2B, a scan signal is output from the scan driver SDV and transmitted along a scan line. During the above process, an RC delay occurs in the scan signal.

A pixel PX-R disposed on the right side of the second region DP-TA receives a scan signal passed the second portion SL-P2 illustrated in FIG. 4C. That is, compared to a pixel PX-L disposed on the left side, the pixel PX-R disposed on the right side receives a scan signal greatly delayed, so that the operation of the pixel may be delayed. For example, the capacitor Cst described with reference to FIG. 3A may not be sufficiently charged. Accordingly, there may be a difference in luminance of an image according to a region.

A photograph B00 on the right side of FIG. 4H is a green colored image displayed on the display panel DP according to an embodiment of the inventive concepts illustrated in FIG. 4D. It can be seen that luminance of a right-side region of an image and luminance of a left-side region thereof are decreased compared to those of the photograph H00 on the left side. This is because the compensation line CL decreased resistance of a scan line, so that a scan signal lowered an RC delay.

Although not illustrated in FIG. 4D, each of the scan lines of the second group, the scan lines of the third group, and the light emission lines, all of which are corresponding to the pixel rows of the second group PXL-2, may include a plurality of portions.

FIG. 4I illustrates the second pixel row PXL2, and second portions SL-P2 of each of scan lines of a first group SL-1, scan lines of a second group GL-1, scan lines of a third group HL-1, and light emission lines EL-1 of a pixel row PXL4 (hereinafter, a fourth pixel row) immediately adjacent thereto. Referring to FIG. 4D, the fourth pixel row PXL4 is disposed between the second pixel row PXL2 and the third pixel row PXL3. In the embodiment described herein, the light emission line EL-1 is illustrated as being disposed for each pixel row, but two adjacent pixel rows may share one light emission line EL-1.

The second portion SL-P2 of a scan line of the second group GL-1 and the second portion SL-P2 of a scan line of the third group HL-1, which are disposed on the same layer as the first gate G1 (see FIG. 3C), are illustrated. A first portion and a third portion of each of a scan line of the second group GL-1 and a scan line of the third group HL-1 may be disposed on the same layer as the third gate G3 (see FIG. 3C). The second portion SL-P2 and the first portion of each of the scan line of the second group GL-1 and the scan line of the third group HL-1 may be electrically connected through a bridge electrode not illustrated. The second portion SL-P2 and the third portion of each of the scan line of the second group GL-1 and the scan line of the third group HL-1 may be electrically connected through a bridge electrode. The second portion SL-P2 of the light emission line EL-1 disposed on the same layer as the upper electrode UE (see FIG. 3C) is illustrated. A first portion and a third portion of the light emission lines EL-1 may be disposed on the same layer as the first gate G1 (see FIG. 3C). The second portion SL-P2 and the first portion of the light emission line EL-1, or the second portion SL-P2 and the third portion thereof may be electrically connected through a bridge electrode.

Figure 5A:
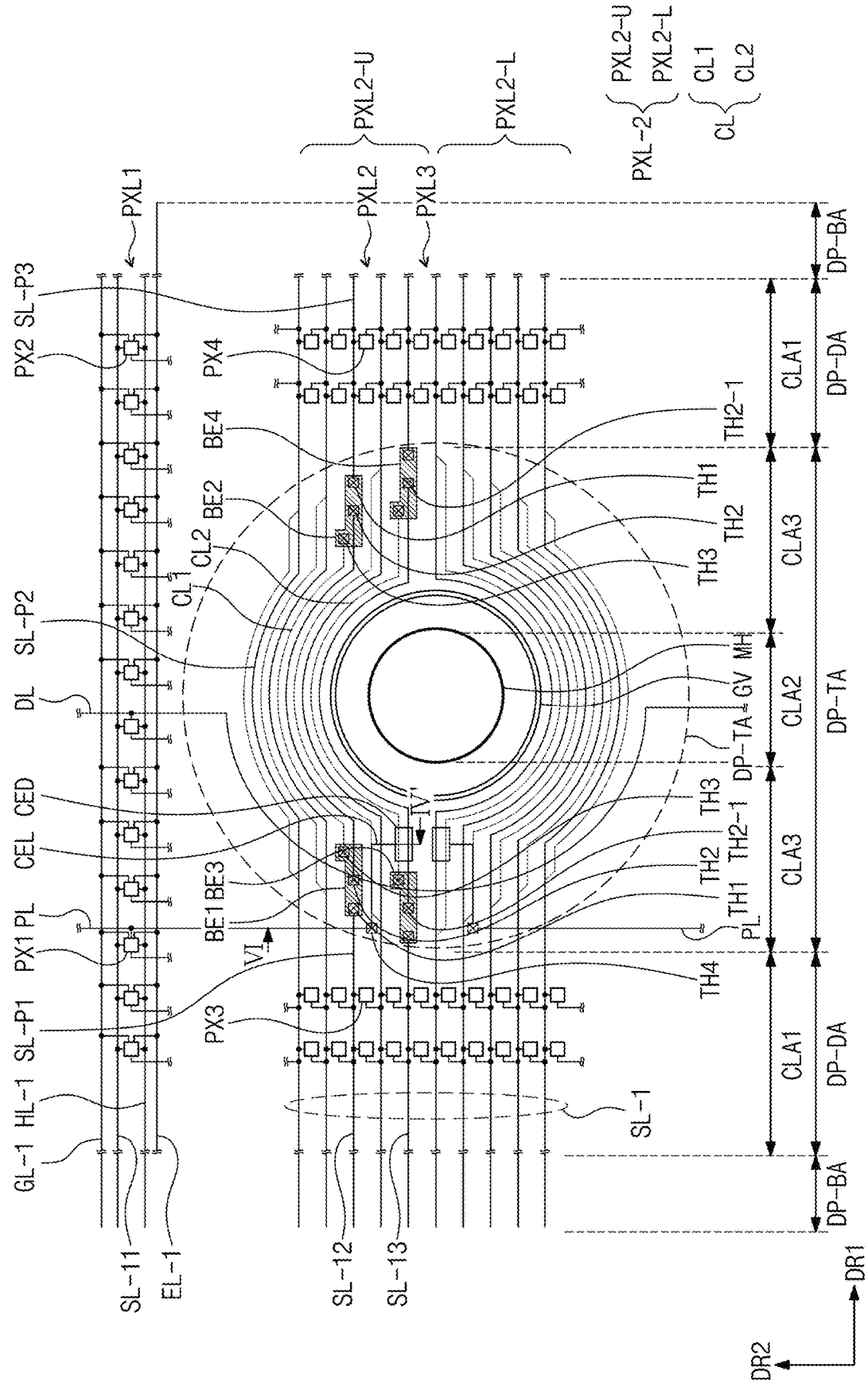
FIG. 5A is a plan view illustrating a signal line and a pixel disposed around a pixel row disconnection region of a display panel according to an embodiment.
Figure 5B:
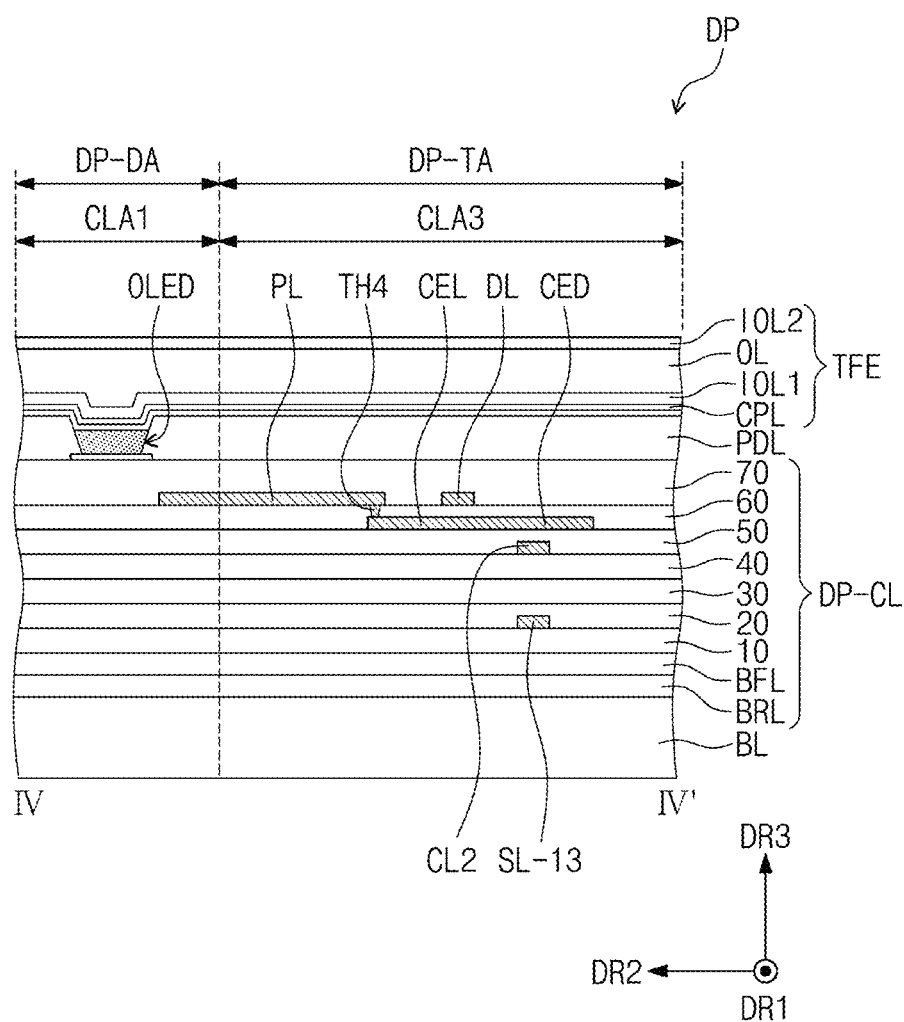
FIG. 5B is a cross-sectional view corresponding to line IV-IV' of FIG. 5A.

FIG. 5A is a plan view illustrating a signal line and a pixel disposed around the pixel row disconnection region DP-TA of the display panel DP according to an embodiment of the inventive concepts. FIG. 5B is a cross-sectional view corresponding to line IV-IV' of FIG. 5A. Hereinafter, detailed descriptions of the same compositions as those described with reference to FIG. 1 to FIG. 4I will be omitted for sake of brevity.

Unlike FIG. 4D, FIG. 5A and FIG. 5B illustrate one of the first voltage lines PL illustrated in FIG. 2B. The first voltage line PL may be disposed to correspond to each pixel column. As illustrated in FIG. 5B, the first voltage line PL is disposed on the sixth insulation layer 60. The first voltage line PL is disposed on the same layer as the second connection electrode CNE20 illustrated in FIG. 3C.

According to the embodiment described herein, a compensation electrode CED disposed in the second region DP-TA is further included. The compensation electrode CED is disposed in the third region CLA3 of the circuit element layer DP-CL. The compensation electrode CED is disposed on a different layer from the scan lines of the first group SL-1, and the compensation electrode CED is disposed on a different layer from the first compensation line CL1 and the second compensation line CL2.

Referring to FIG. 5A, unlike the third scan line SL-13 illustrated in FIGS. 4D and 4F, an integrated third scan line SL-13 is illustrated. Each of the third and fourth bridge electrodes BE3 and BE4 connects the second compensation line CL2 to the third scan line SL-13 through the first and third contact holes TH1 and TH3.

Among the scan lines of the first group SL-1 corresponding to the pixel rows of the second group PXL-2, the compensation electrode CED overlaps a scan line of the first group having relatively low combined resistance. The combined resistance is combined resistance of the scan line of the first group and a compensation line corresponding thereto. Referring to FIG. 4G, it can be seen that the combined resistance of the third scan line SL-13 is relatively lower than that of the second scan line SL-12. Therefore, the compensation electrode CED overlaps at least one of the third scan line SL-13 and the second compensation line CL2. The compensation electrode CED does not overlap the second scan line SL-12 and the second compensation line CL2.

The compensation electrode CED may receive the first power voltage ELVDD. As illustrated in FIG. 5B, the connection line CEL connects the compensation electrode CED and the first voltage line PL. The connection line CEL and the compensation electrode CED may have an integral shape. The connection line CEL and may be connected to the first voltage line PL through a fourth through-hole TH4 passing through the sixth insulation layer 60. The data line DL is disposed on the connection line CEL and intersects the connection line CEL. The connection line CEL corresponds to a bridge line for avoiding interference.

The compensation electrode CED and at least one of the third scan line SL-13 and the second compensation line CL2 define a capacitor. Thus the capacitor may decrease an impedance deviation of scan lines having different lengths.

There is a delay deviation between scan signals moving in the scan lines of the first group SL-1 corresponding to the pixel rows of the second group PXL-2. When a capacitor is not formed, the delay deviation depends on the deviation of the combined resistance illustrated in FIG. 4G. The capacitor increases impedance of the signal line having relatively low combined resistance. Therefore, an impedance deviation between the signal line having relatively low combined resistance and a signal line having relatively high combined resistance is decreased. That is, RC delays of scan signals moving in the second scan line SL-12 and the third scan line SL-13 may have similar values. A luminance deviation of two pixels disposed on the right side of the second region CLA2 and connected to each of the second scan line SL-12 and the third scan line SL-13 may be decreased.

Figure 6:
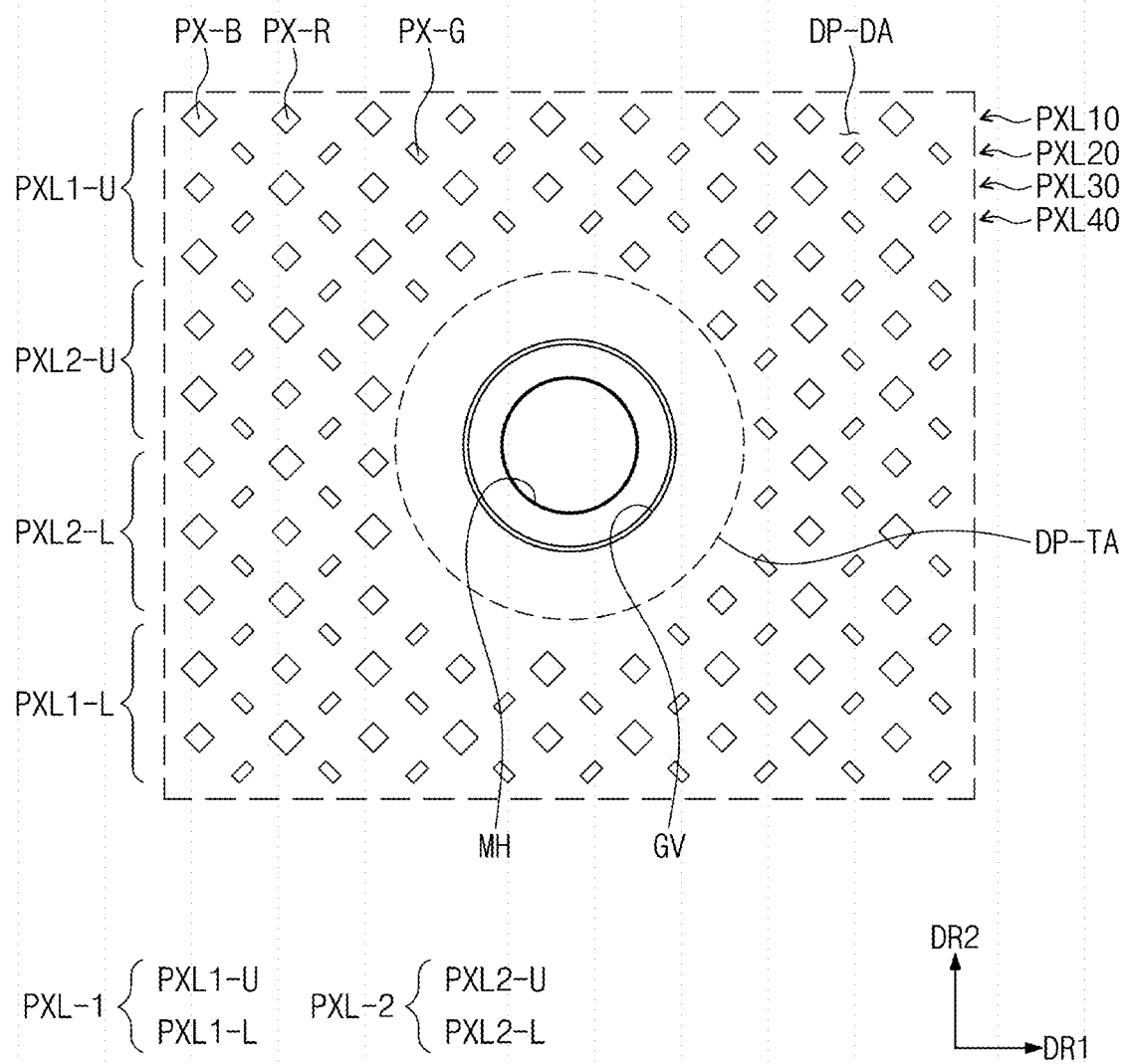
FIG. 6 is a plan view illustrating a signal line and a pixel disposed around a pixel row disconnection region of a display panel according to an embodiment.

FIG. 6 is a plan view illustrating a signal line and pixels PX-R, PX-G, and PX-B disposed around the pixel row disconnection region DP-TA of the display panel DP according to an embodiment.

Among pixel rows of the first group PXL-1 and pixel rows of the second group PXL-2, every four pixel rows disposed in succession along the second direction may have the same pixel arrangement. However, the pixel rows of the second group PXL-2 have a region in which a pixel is not disposed due to the pixel row disconnection region DP-TA.

In the embodiment described herein, a first pixel row PXL10 and a third pixel row PXL30 include two types of pixels PX-R and PX-B, and a second pixel row PXL20 and a fourth pixel row PXL40 may include one type of pixels PX-G. The first pixel row PXL10 and the third pixel row PXL30 may include red pixels PX-R and blue pixels PX-B alternately disposed along the first direction DR1. The pixel disposition of the first pixel row PXL10 and the third pixel row PXL30 may be the same or different from each other. The second pixel row PXL20 and the fourth pixel row PXL40 may include green pixels PX-G. Pixels of the first pixel row PXL10 and the third pixel row PXL30 and pixels of the second pixel row PXL20 and the fourth pixel row PXL40 are not arranged in the second direction DR2, and define different pixel rows from each other.

Figure 7A:
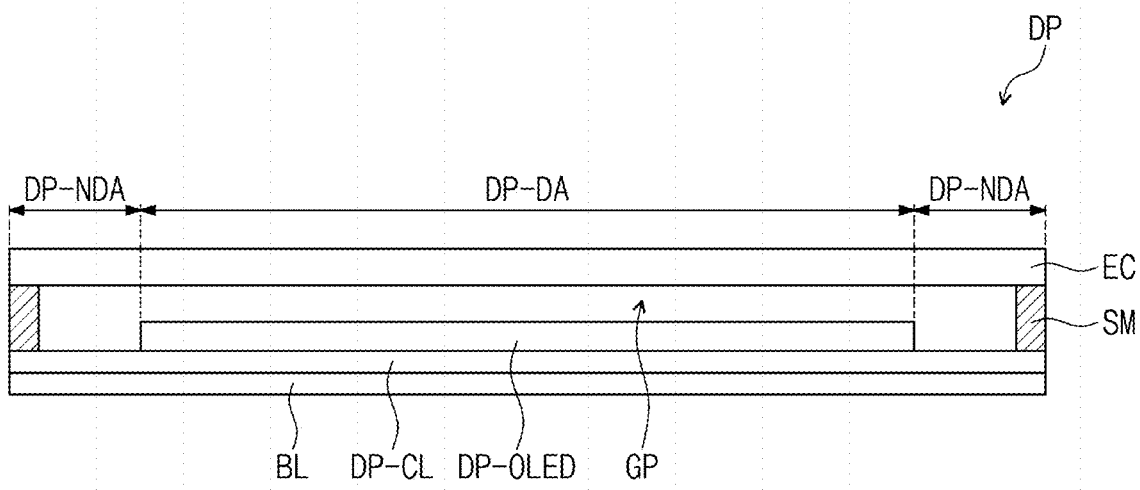
FIG. 7A is a cross-sectional view of a display panel according to an embodiment.
Figure 7B:
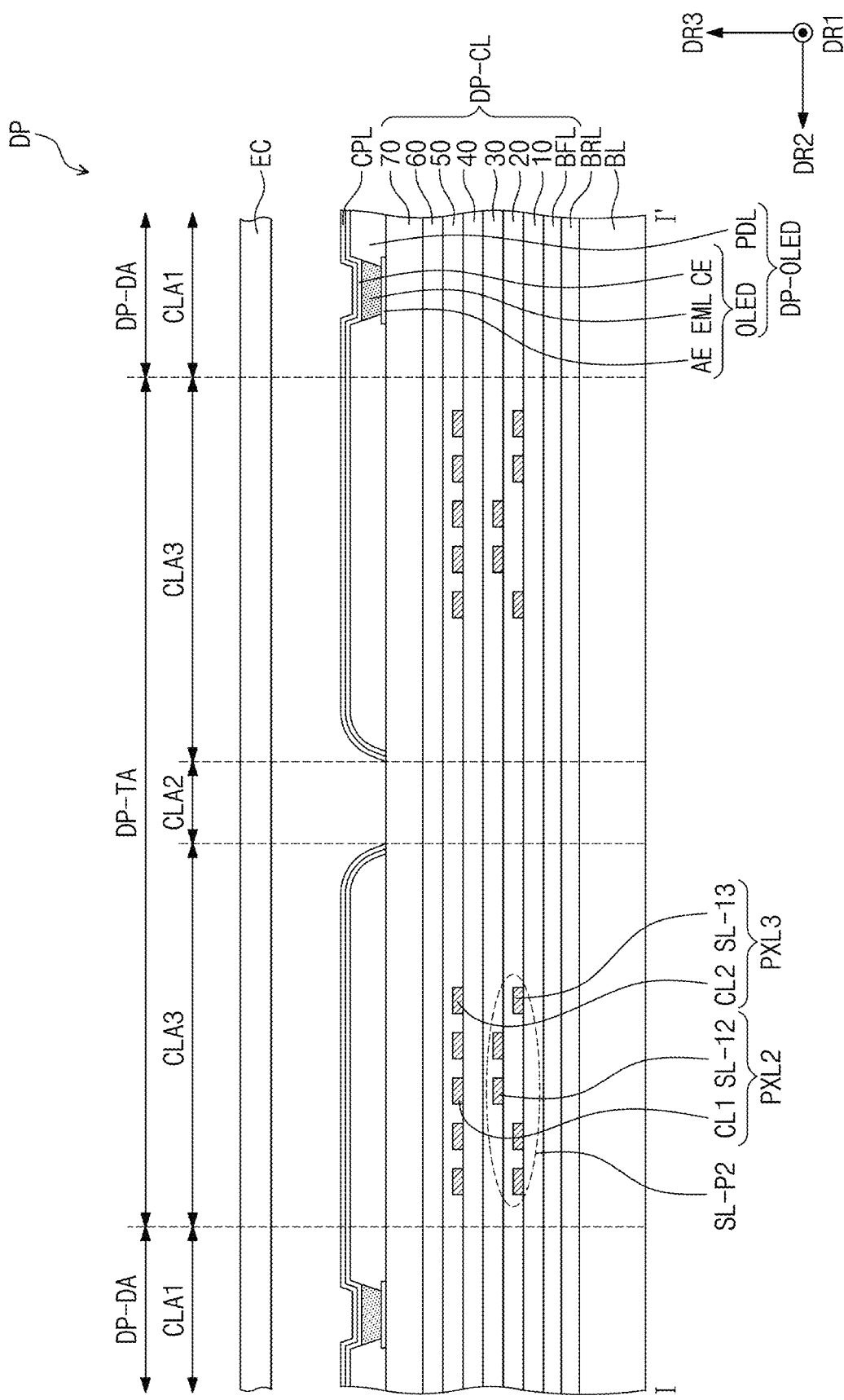
FIG. 7B is a cross-sectional view of a pixel row disconnection region of a display panel according to an embodiment.

FIG. 7A is a cross-sectional view of the display panel DP according to an embodiment. FIG. 7B is a cross-sectional view of the pixel row disconnection regions DP-TA according to an embodiment.

When compared to the display panel DP illustrated in FIG. 3A to FIG. 4I, the display panel DP according to the embodiment does not include the thin film encapsulation layer TFE. The display panel DP according to the embodiment described herein includes an encapsulation substrate EC and a sealing member SM. In addition, the base layer BL may include a glass substrate. In addition, the base layer BL may include a substrate having a substantially constant refractive index in the visible light wavelength range.

The encapsulation substrate EC may be a transparent substrate. The encapsulation substrate EC may include a glass substrate. In addition, the encapsulation substrate EC may include a substrate having a substantially constant refractive index in the visible light wavelength range. The sealing member SM may couple a lower display substrate and the encapsulation substrate EC. The sealing member SM may be extended along an edge of the encapsulation substrate EC.

In a gap GP defined inside the display panel DP, air or inert gases or water substances may be filled. The encapsulation substrate EC and the sealing member SM may prevent moisture from penetrating into the lower display substrate.

The sealing member SM may include an inorganic adhesive layer such as a frit. However, the embodiment is not limited thereto. The sealing member SM may include an organic adhesive layer. In the embodiment described herein, the display panel DP may be completely sealed from the outside, and thus, the strength thereof may be improved and defects of a light emitting element may be prevented.

Unlike the display panel DP illustrated in FIG. 3A to FIG. 4I, the display panel DP according to the embodiment does not have the module hole MH. The display panel DP according to the embodiment has a signal transmission region of a different shape from the module hole MH.

The thickness of a first portion of the display element layer DP-OLED corresponding to the second region CLA2 is smaller than the thickness of a second portion of the display element layer DP-OLED corresponding to the third region CLA3. A region corresponding to the second region CLA2 of the display panel DP is a signal transmission region, and may have a larger light transmittance than other regions of the display panel DP.

In the second region CLA2 of the circuit element layer DP-CL, a portion or all of the display element layer DP-OLED may not be disposed. The signal transmission region may correspond to the second region CLA2 of the circuit element layer DP-CL. In the second region CLA2 of the circuit element layer DP-CL, at least a metal pattern is not disposed. In an embodiment of the inventive concepts, a portion or all of an insulation layer may not be disposed in the second region CLA2 of the circuit element layer DP-CL when compared to other regions.

According to the above description, an impedance deviation of scan lines having different lengths may be decreased. A compensation line connects two points of a relatively long scan line. Combined resistance of a scan line and the compensation line is smaller than resistance of the scan line. Therefore, a delay of a signal moving to the relatively long scan line is decreased.

A compensation electrode overlapping a signal line having relatively low combined resistance forms a capacitor. The capacitor increases impedance of the signal line having relatively low combined resistance. Therefore an impedance deviation between the signal line having relatively low combined resistance and a signal line having relatively high combined resistance is decreased.

In order to reduce a non-display region disposed in a display region, a first compensation line connected to a second scan line and a second compensation line connected to a third scan line are disposed on different layers from each other.

Although certain illustrative embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising a display panel including a first region in which first pixels of a first pixel row, second pixels of a second pixel row, and third pixels of a third pixel row are disposed, and a second region in which the second pixel row and the third pixel row are disconnected and which includes a signal transmission region, wherein the display panel includes:
   a first scan line which is electrically connected to the first pixels and overlaps the first region;
   a second scan line which is electrically connected to the second pixels, overlaps the first region and the second region, and is longer than the first scan line;

a third scan line which is electrically connected to the third pixels, overlaps the first region and the second region, and is longer than the second scan line;

a first compensation line which is disposed on a different layer from the first to third scan lines, and electrically connects a first point of the second scan line and a second point of the second scan line; and a second compensation line which is disposed on a different layer from the first to third scan lines, and electrically connects a first point of the third scan line and a second point of the third scan line, wherein the first point of the second scan line and the first point of the third scan line are disposed on one side of the signal transmission region, the second point of the second scan line and the second point of the third scan line are disposed on the other side of the signal transmission region, the first compensation line and the second scan line have a combined resistance lower than a resistance of the second scan line without the first compensation line, and the second compensation line and the third scan line have a combined resistance lower than a resistance of the third scan line without the second compensation line.

2. The display device of claim 1, wherein the signal transmission region is a region in which an optical signal is transmitted, and wherein the second region comprises a wiring region which is adjacent to the signal transmission region, wherein the first compensation line and the second compensation line overlap the wiring region.

3. The display device of claim 2, wherein the signal transmission region passes through the display panel.

4. The display device of claim 2, wherein the display panel comprises:

a base layer;

a circuit element layer disposed on the base layer and including the first scan line, the second scan line, and the third scan line; and a display element layer disposed on the circuit element layer, wherein a thickness of the signal transmission region of the display panel is smaller than a thickness of the wiring region.

5. The display device of claim 2, wherein the display panel comprises:

a base layer;

a circuit element layer disposed on the base layer and including the first scan line, the second scan line, and the third scan line;

a display element layer disposed on the circuit element layer; and an encapsulation substrate configured to encapsulate the display element layer, wherein a thickness of a first portion of the display element layer corresponding to the signal transmission region is smaller than a thickness of a second portion of the display element layer corresponding to the wiring region.

6. The display device of claim 2, wherein the first to fourth points are positioned in the second region.

7. The display device of claim 1, wherein in the first region, the first scan line, the second scan line, and the third scan line are disposed on a same layer.

8. The display device of claim 1, wherein:

in the second region, the second scan line and the third scan line are disposed on different layers from each other; and in the second region, the first compensation line and the second compensation line are disposed on different layers from the second scan line and the third scan line.

9. The display device of claim 1, wherein in the second region, the first compensation line and the second compensation line are disposed on a same layer.

10. The display device of claim 1, further comprising a bridge electrode, wherein:

the second scan line includes a first portion disposed in the first region, and a second portion disposed in the second region and disposed on a different layer from the first portion and the bridge electrode connects the first portion, the second portion, and the first compensation line.

11. The display device of claim 1, wherein:

one first pixel of the first pixels connected to the first scan line is disposed on one side of the second region, and another first pixel thereof is disposed on another side of the second region; and one second pixel of the second pixels connected to the second scan line is disposed on one side of the second region, and another second pixel thereof is disposed on another side of the second region, wherein:

the one first pixel and the one second pixel are disposed in a first pixel column; and the another first pixel and the another second pixel are disposed in a second pixel column.

12. The display device of claim 1, wherein a portion of the second scan line overlapping the second region has a curved shape, and the first compensation line overlaps the portion of the curved shape.

13. The display device of claim 1, wherein the second compensation line is longer than the first compensation line.

14. The display device of claim 13, further comprising a compensation electrode disposed in the second region, wherein:

the compensation electrode is disposed on a different layer from the third scan line, the first compensation line, and the second compensation line;

the compensation electrode overlaps at least one of the third scan line and the second compensation line; and the compensation electrode does not overlap the second scan line and the first compensation line.

15. The display device of claim 14, wherein:

each of the first pixels receives a first power voltage and a second power voltage which is lower than the first power voltage; and the compensation electrode receives the first power voltage.

16. The display device of claim 15, further comprising:

a voltage line extended in a direction intersecting the first to third pixel rows, disposed on a different layer from the third scan line, the first compensation line, and the second compensation line, and transmitting the first power voltage; and a connection line connecting the voltage line and the compensation electrode.

17. The display device of claim 16, further comprising a data line disposed in the first region and the second region, and electrically connected to corresponding pixels among the first pixels, the second pixels, and the third pixels, wherein a portion of the data line overlaps the connection line in the second region.

18. The display device of claim 1, wherein a combined resistance of the third scan line and the second compensation line is smaller than a combined resistance of the second scan line and the second compensation line.

19. The display device of claim 1, wherein the display device is foldable based on a folding axis overlapping the first region.

20. The display device of claim 1, wherein each of the first pixels comprises:
- a light emitting diode electrically connected to a first voltage line which receives a first power voltage, and in which the light emitting diode receives a second power voltage which is lower than the first power voltage;
- a capacitor electrically connected between the first voltage line and a reference node;
- a first transistor electrically connected between the first voltage line and a first electrode of the light emitting diode;
- a second transistor electrically connected between a data line and a source or a drain of the first transistor;
- a third transistor electrically connected between the reference node and the drain or the source of the first transistor;
- a fourth transistor electrically connected between a second voltage line receiving an initialization voltage and the reference node;
- a fifth transistor electrically connected between the first voltage line and the source or the drain of the first transistor;
- a sixth transistor electrically connected between the drain or the source of the first transistor and the light emitting diode; and
- a seventh transistor electrically connected between the second voltage line and the first electrode of the light emitting diode.

21. The display device of claim 20, wherein:
the first transistor, the second transistor, the fifth transistor, and the sixth transistor are P-type transistors; and
the third transistor and the fourth transistor are N-type transistors.

22. The display device of claim 20, wherein:
an active region of each of the first transistor, the second transistor, the fifth transistor, and the sixth transistor comprises polysilicon; and
an active region of each of the third transistor and the fourth transistor comprises a metal oxide.

23. A display device comprising a display panel including a first region in which pixels are disposed and a second region in which pixels are not disposed and having a light transmittance that is higher than that of the first region, wherein the display panel comprises:
- a first scan line which is electrically connected to corresponding pixels among the pixels, overlaps the first region, and does not overlap the second region;
- a second scan line which is electrically connected to corresponding pixels among the pixels, overlaps the first region and the second region, and is longer than the first scan line;
- a third scan line which is electrically connected to corresponding pixels among the pixels, overlaps the first region and the second region, and is longer than the second scan line;
- a first compensation line which is disposed on a different layer from the first to third scan lines, and electrically connects a first point of the second scan line and a second point of the second scan line; and
- a second compensation line which is disposed on a different layer from the first compensation line and the first to third scan lines, and electrically connects a first point of the third scan line and a second point of the third scan line, wherein the first point of the second scan line and the first point of the third scan line are disposed on one side of the signal transmission region, the second point of the second scan line and the second point of the third scan line are disposed on the other side of the signal transmission region, the first compensation line and the second scan line have a combined resistance lower than a resistance of the second scan line without the first compensation line, and the second compensation line and the third scan line have a combined resistance lower than a resistance of the third scan line without the second compensation line.

24. The display device of claim 23, further comprising a compensation electrode disposed in the second region, wherein:
the compensation electrode is disposed on a different layer from the third scan line, the first compensation line, and the second compensation line;
the compensation electrode overlaps at least one of the third scan line and the second compensation line; and
the compensation electrode does not overlap the second scan line and the first compensation line.

* * * * *